(12) United States Patent
Hosokawa

(10) Patent No.: US 6,538,374 B2
(45) Date of Patent: Mar. 25, 2003

(54) ACTIVELY DRIVEN ORGANIC EL DEVICE AND MANUFACTURING METHOD THEREOF

(75) Inventor: Chishio Hosokawa, Sodegaura (JP)

(73) Assignee: Idemitsu Kosan Co., Ltd. (JP)

(*) Notice: Subject to any disclaimer, the term of this patent is extended or adjusted under 35 U.S.C. 154(b) by 203 days.

(21) Appl. No.: 09/784,030

(22) Filed: Feb. 16, 2001

(65) Prior Publication Data

US 2002/0011783 A1 Jan. 31, 2002

(30) Foreign Application Priority Data

Feb. 16, 2000 (JP) ........................................ 2000-038756

(51) Int. Cl.$^7$ ................................................ H01J 63/04
(52) U.S. Cl. ........................ 313/504; 313/503; 313/506; 315/169.3; 345/76
(58) Field of Search ................................ 313/504, 506, 313/503, 509; 315/169.3; 345/76, 92, 45; 445/24

(56) References Cited

FOREIGN PATENT DOCUMENTS

| JP | 2-37385 | 2/1990 |
| JP | 3-233891 | 10/1991 |
| JP | 7-111341 | 4/1995 |
| JP | 7-122360 | 5/1995 |
| JP | 7-122361 | 5/1995 |
| JP | 7-153576 | 6/1995 |
| JP | 7-312290 | 11/1995 |
| JP | 8-054836 | 2/1996 |
| JP | 8-109370 | 4/1996 |
| JP | 8-129359 | 5/1996 |
| JP | 8-227276 | 9/1996 |
| JP | 8-241047 | 9/1996 |
| JP | 10-189252 | 7/1998 |
| JP | 10-289784 | 10/1998 |
| JP | 10-308284 | 11/1998 |
| JP | 10-335068 | 12/1998 |
| JP | 11-339968 | 12/1999 |

Primary Examiner—Sandra O'Shea
Assistant Examiner—Guiyoung Lee
(74) Attorney, Agent, or Firm—Parkhurst & Wendel, L.L.P

(57) ABSTRACT

The present invention is a active-driving organic EL light emission device comprising an organic EL element comprising an organic luminous medium between an upper electrode and a lower electrode, and a thin film transistor for driving this organic EL element, wherein light emitted from the organic EL element is taken out from the side of the upper electrode, and the upper electrode comprises a main electrode formed of transparent conductive material, and an auxiliary electrode formed of a low-resistance material. According to the active-driving organic EL light emission device of this structure, the numerical aperture can be made large. Additionally, the sheet resistivity of the upper electrode can be made low even if luminescence is taken out from the side of the upper electrode. Thus, it is possible to provide an active-driving organic EL light emission device making it possible to display images having a high brightness and a homogenous brightness; and a method for manufacturing the same.

25 Claims, 11 Drawing Sheets

ACTIVELY DRIVEN ORGANIC EL DEVICE AND MANUFACTURING METHOD THEREOF

BACKGROUND OF THE INVENTION

1. Field of the Invention

The present invention relates to an active-driving organic EL light emission device (which may be referred to merely as an organic EL device hereinafter) having a thin film transistor (which may be referred to as a TFT). More specifically, the present invention relates to an organic EL device used suitably for display equipment and color displays for the people's livelihood and industries, and the like.

In the present specification, the description "EL" means "electroluminescence".

2. Description of the Related Art

Conventionally, it is known a simple-driving organic EL light emission device which is simply driven by XY matrix electrodes to display an image (Japanese Patent Application Laid-Open (JP-A) No. 37385/1990, JP-A No. 233891/1991 and the like) as an organic EL light emission device (display).

However, in such a simple-driving organic EL light emission device, the so-called line sequential driving is performed. Therefore, if the number of scanning lines is several hundreds, required instantaneous brightness is several-hundred times larger than observed brightness so that the following problems arise.

(1) Since a driving voltage becomes not less than 2–3 times higher than a direct-current constant voltage, luminous efficiency drops or power consumption becomes large.

(2) Since the electrical current that passes instantaneously becomes several-hundred times larger, the organic luminous layer is apt to deteriorate.

(3) Since the electrical current is very large in the same manner as in the (2), a voltage-drop in the electrode wiring becomes large.

Thus, in order to solve the problems that simple-driving organic EL light emission devices have, various active-driving organic EL light emission devices, wherein organic EL elements are driven by TFTs (thin film transistors), are suggested (JP-A No. 122360/1995, JP-A No. 122361/1995, JP-A No. /153576/1995, JP-A No. 54836/1996, JP-A No. 111341/1995, JP-A No. 312290/1995, JP-A No. 109370/1996, JP-A No. 129359/1996, JP-A No. 241047/1996, JP-A No. 227276/1996, JP-A No. 339968/1999, and the like).

Examples of the structure of such an active-driving organic EL light emission device are shown in FIGS. 18 and 19. According to such active-driving organic EL light emission devices, it is possible to obtain advantages as follows: driving voltage is highly lowered, luminous efficiency is improved and power consumption can be reduced, as compared with simple-driving organic EL light emission devices.

However, the following problems (1)–(3) are caused even in active-driving organic EL light emission devices having advantageous as described above.

(1) The aperture ratio of their pixels becomes small.

In an active-driving organic EL light emission device, at least one TFT is fitted to each pixel on a transparent substrate and further a great deal of scanning electrode lines and signal electrode lines are disposed on the substrate to select appropriate TFTs and drive them. Accordingly, there arises a problem that when light is taken out from the side of the transparent substrate, the aperture ratio of the pixels (the ratio of portions that emits light actually in the pixels) becomes small since the TFTs and the various electrode lines shut off the light. For example, in an active-driving organic EL light emission device that has been developed recently, TFTs for driving organic EL elements at a constant current are disposed besides the above-mentioned two kinds of TFTs. Therefore, its aperture ratio becomes smaller and smaller (about 30% or less). As a result, dependently on the aperture ratio, the current density that passes through the organic luminous medium becomes large, causing a problem that the life span of the organic EL elements is shortened.

This matter will be described in more detail, referring to FIGS. 10, 11 and 18. FIG. 10 shows a diagram of a circuit for switch-driving the active-driving organic EL light emission device 100 illustrated in FIG. 18, and illustrates a state that gate lines (scanning electrode lines) 50 (108 in FIG. 18) and source lines (signal electrode lines) 51 are formed on the substrate and they are in an XY matrix form. Common electrode lines 52 are disposed in parallel to the source lines (signal electrode lines) 51. About each pixel, a first TFT 55 and a second TFT 56 are fitted to the gate lines 50 and the source lines 51. A capacitance 57 is connected between the gate of the second TFT 56 and the common electrode line 52 to hold the gate voltage at a constant value.

Therefore, an organic EL element 26 can be effectively driven by applying the voltage held by the capacitance 57 to the gate of the second TFT 56 shown in the circuit diagram of FIG. 10 and then attaining switching.

The plan view shown in FIG. 11 is a view obtained by seeing, along the plane direction, through switch portions and the like according to the circuit diagram shown in FIG. 10.

Thus, the active-driving organic EL light emission device 100 has a problem that when EL light is taken out from the side of lower electrodes (ITO, indium tin oxide) 102 side, that is, the side of a substrate 104 side, a TFT 106, a gate line 108, a source line (not illustrated) and the like shut off EL light so that the aperture ratio of pixels becomes small.

In an active-driving organic EL light emission device 204, as shown in FIG. 19, wherein a TFT 200 and an organic EL element 202 are arranged on the same plane, the TFT 200 and the like never block off EL light. However, its aperture ratio of pixels is further lowered, as compared with the active-driving organic EL light emission device 100 shown in FIG. 18.

(2) The sheet resistivity of upper electrodes is large.

In the case that light is taken out from the side opposite to the substrate, that is, the side of upper electrodes, the TFTs and the like do not shut off the light to keep the aperture ratio large. As a result, a high-brightness image can be obtained. However, when EL light is taken out from the upper electrode side, in order to take out the EL light effectively to the outside, it is necessary to form the upper electrodes from transparent conductive material. For this reason, the sheet resistivity of the upper electrodes exceeds, for example, 20 $\Omega/\square$, resulting in a serious problem at the time of using large-area display.

In the case that light is emitted, for example, at a brightness of 300 nit from the entire surface of an EL light emission device having a diagonal size of 20 inches (the ratio of length to breadth, 3:4), it is necessary to send a large current having a current of 3600 mA to the upper electrodes even if an organic luminous material having a high luminous efficiency of 10 cd/A (luminous power per unit amperage) is used in the organic luminous medium.

More specifically, the value of a voltage-drop based on the resistances of the upper electrodes is represented by Σnir and calculated on the following formula.

$$\Sigma nir = \tfrac{1}{2} \times N(N+1)ir$$

N: (the total number of pixels in the longitudinal direction)×½, r: the ohmic value (Ω) of the upper electrode in each pixel, and i: a constant current value (A) that flows through each pixel.

Therefore, if luminous efficiency, luminous brightness, the shape of the pixels and the sheet resistivity of the upper electrodes are set to, for example, 10 cd/A, 300 nit, 200×600 μm square, and 20 Ω/□, respectively, the pixel current value is $3.6 \times 10^{-6}$ A. If the total number of the pixels in the longitudinal direction is set to 2000, drop-voltage in the longitudinal direction is 12V (½×1000×1000×$3.6 \times 10^{-6}$×20×⅓). This exceeds an allowable voltage range (10 V) for driving circuits which are driven at a constant current. Thus, it is difficult to emit light under the above-mentioned conditions.

In short, if the sheet resistivity of the upper electrodes is large, voltage-drop, particularly at the center of the screen, becomes large accordingly. As a result, a problem that brightness is remarkably lowered becomes apparent. Incidentally, the following is also attempted: amendment is made by using a circuit to make a current value (brightness) constant for each pixel. However, this attempt is insufficient.

(3) From the viewpoint of production, it is difficult to control the ohmic value of the upper electrodes.

It is known that in order to set the resistivity of the upper electrodes of an active-driving organic EL light emission device having a diagonal size of several inches to 10 inches to a low value, for example, $1 \times 10^{-3}$ Ω·cm or less by using an ordinary material such as ITO or ZnO, it is necessary to set heating temperature to 200° C. or higher. However, heat-resistance of ordinary organic luminous media is 200° C. or lower. Thus, it is necessary to set the heating temperature to 200° C. or lower. Accordingly, the value of the resistivity of the upper electrodes cannot be controlled so that the value may exceed $1 \times 10^{-3}$ Ω·cm. As a result, a problem that the sheet resistivity becomes a high value over 20 Ω/□ occurs. In the case that plasma is used for sputtering at the time of forming an oxide such as ITO or IZO on the organic luminous medium to form the upper electrodes, a problem that the organic luminous medium is damaged by the plasma also arises.

In light of the above-mentioned problems, the present invention has been made. Its object is to provide an organic active EL light emission device making it possible to increase the aperture ratio of respective pixels even if TFTs are disposed to drive organic EL elements, reduce the sheet resistivity of upper electrodes even if luminescence is taken out from the side of the upper electrodes, and display an image having a high brightness and a homogeneous brightness; and a method for manufacturing such an organic active EL light emission device effectively.

SUMMARY OF THE INVENTION

[1] The present invention is an active-driving organic EL light emission device comprising an organic EL element comprising an organic luminous medium between an upper electrode and a lower electrode, and a thin film transistor for driving this organic EL element, wherein light emitted from the organic EL element (EL light) is taken out from the side of the upper electrode, and the upper electrode comprises a main electrode formed of a transparent conductive material (embracing a transparent semiconductor material), and an auxiliary electrode formed of a low-resistance material.

Such a structure makes it possible to make a numerical aperture large even if a TFT is set up and make the sheet resistivity of the upper electrode reduced even if luminescence is taken out from the side of the upper electrode.

It is also possible to improve brightness and further prolong the life span of the organic luminous medium remarkably because of a reduction in the density of electric current passing through the organic luminous medium.

[2] The active-driving organic EL light emission device of the present invention preferably comprises an electric switch comprising the thin film transistor and a transistor for selecting a pixel, and a signal electrode line and a scanning electrode line for driving the electric switch.

Namely, it is preferred to comprise a scanning electrode line and a signal electrode line arranged, for example, in an XY matrix form, and an electric switch composed of a TFT connected electrically to these electrode lines and a transistor for selecting a pixel.

Such a structure makes it possible to drive the organic EL element effectively by selecting any pixel, applying a scanning signal pulse and a signal pulse through the scanning electrode line and the signal electrode line and thus performing switching-operation of the electric switch comprising the TFT.

[3] In the structure of the active-driving organic EL light emission device of the present invention, it is preferred that the transparent conductive material is at least one material selected from the group consisting of a conductive oxide, a light-transmissible metal film, a non-degeneracy semiconductor, an organic conductor, and a semiconductive carbon compound.

Namely, the sheet resistivity of the upper electrode can be reduced. It is therefore possible to use, in the main electrode, not only transparent conductive material that has been conventionally used but also transparent conductive material other than it. Thus, the above-mentioned transparent conductive material has also been able to be used.

It is possible to use a non-degeneracy semiconductor and the like, for example, which can be made into a film at a low temperature, preferably 200° C. or lower and more preferably 100° C. or lower. It is therefore possible to make heat damage of any organic layer at the time of film-making small. Vapor deposition at low temperature or wet coating can be attained by using the organic conductor, the semiconductive carbon compound and the like.

[4] In the structure of the active-driving organic EL light emission device of the present invention, it is preferred that a plurality of the auxiliary electrodes are regularly placed in a plane.

For example, the resistance of the upper electrode can be uniformly and effectively made low by arranging the auxiliary electrode in a matrix, stripe and the like form.

[5] In the structure of the active-driving organic EL light emission device of the present invention, it is preferred that a sectional shape of the auxiliary electrode is an overhang form.

Such a structure makes it possible to connect certainly the auxiliary electrode electrically to the upper electrode, using a site positioned below the overhanging upper portion (embracing a conversely-tapered portion and the like) even if an insulating organic layer is deposited on the auxiliary electrode.

[6] In the structure of the active-driving organic EL light emission device of the present invention, it is preferred that the auxiliary electrode comprises a lower auxiliary electrode and an upper auxiliary electrode.

Such a structure of the auxiliary electrode makes it possible to easily connect the auxiliary electrode electrically to the main element, using the lower auxiliary electrode or the upper auxiliary electrode. Since the assistant is separated into the lower auxiliary electrode and the upper auxiliary electrode as described above, the overhanging form can easily be made.

[7] In the structure of the active-driving organic EL light emission device of the present invention, it is preferred that the lower auxiliary electrode and the upper auxiliary electrode in the auxiliary electrode comprise constituent materials having different etching rates.

Such a structure makes it possible to form the overhang shape easily by etching.

[8] In the structure of the active-driving organic EL light emission device of the present invention, it is preferred that the lower auxiliary electrode and the upper auxiliary electrode in the auxiliary electrode, or one thereof is electrically connected to the main electrode.

Such a structure makes it possible to connect easily and certainly the auxiliary electrode electrically to the main electrode so that the resistance of the upper electrode can be made low.

[9] In the structure of the active-driving organic EL light emission device of the present invention, it is preferred that the auxiliary electrode is formed on an interlayer insulating film for forming the organic EL element, on the electrically insulating film for insulating electrically the lower electrode, or on the electrically insulating film for insulating electrically the TFT.

Such a structure makes it possible to make the numerical aperture in pixels wide.

[10] In the structure of the active-driving organic EL light emission device of the present invention, it is preferred that an active layer of the TFT is made of polysilicon.

Such a structure makes it possible to produce an active-driving organic EL light emission device whose TFT has high endurance since the active layer made of polysilicon has preferable resistance against the amount of electricity.

[11] In the structure of the active-driving organic EL light emission device of the present invention, it is preferred that an interlayer insulating film is formed on the TFT, the lower electrode of the organic EL element is deposited on the interlayer insulating film, and the TFT and the lower electrode are electrically connected to each other through a via hole made in the interlayer insulating film.

Such a structure makes it possible to obtain superior electrical insulation between the TFT and the organic EL element.

[12] In the structure of the active-driving organic EL light emission device of the present invention, it is preferred that charges are injected from the auxiliary electrode to the main electrode and transported in parallel to a main surface of a substrate, and subsequently the charges are injected to the organic luminous medium.

Such a structure makes it possible to adopt a non-metal compound for the main electrode so that the transparency of the main electrode can be improved. The non-metal compound herein means, for example, a non-degenerate semiconductor, an organic conductor, or a semiconductive carbon compound that will be described later.

[13] In the structure of the active-driving organic EL light emission device of the present invention, it is preferred that the sheet resistivity of the main electrode is set to a value within the range of 1 K to 10 M$\Omega/\square$. In the structure of the active-driving organic EL light emission device of the present invention, it is preferred that the sheet resistivity of the auxiliary electrode is set to a value within the range of 0.01 to 10 $\Omega/\square$.

Adoption of such a structure for the respective electrodes makes it possible to send electrical current giving a high luminous brightness and cause a certain drop in the sheet resistivity of the upper electrode.

[14] In the structure of the active-driving organic EL light emission device of the present invention, it is preferred that a color filter for color-converting the taken-out light and a fluorescent film, or one thereof is arranged on the side of the upper electrode.

Such a structure makes it possible to color-convert luminescence taken out from the upper electrode in the color filter or the fluorescent film so that full-color display can be performed.

[15] In the structure of the active-driving organic EL light emission device of the present invention, it is preferred that a black matrix is formed on a part of the color filter or the fluorescent film, and the black matrix and the auxiliary electrode overlap with each other in a vertical direction.

Such a structure makes it possible to suppress reflection of outdoor daylight on the auxiliary electrode effectively by the black matrix and make numerical aperture wide.

[16] In the structure of the active-driving organic EL light emission device of the present invention, it is preferred that the auxiliary electrode is formed on the main electrode, and an area of the auxiliary electrode is smaller than that of the main electrode.

Such a structure makes it possible to form the auxiliary electrode after the main electrode is formed. Therefore, it is easier to form the auxiliary electrode.

[17] In the structure of the active-driving organic EL light emission device of the present invention, it is preferred that the auxiliary electrode is embedded in a sealing member surrounding a periphery thereof.

Such a structure does not cause the thickness of the organic EL light emission device to be excessively large on the basis of the thickness of the auxiliary electrode. Since the auxiliary electrode can be formed beforehand in the sealing member, sealing based on the sealing member and electrical connection between the auxiliary electrode and the main electrode can be performed at the same time.

[18] In the structure of the active-driving organic EL light emission device of the present invention, it is preferred that the auxiliary electrode is closely arranged between the sealing member and the main electrode.

Such a structure makes it possible to perform sealing based on the sealing member and electrical connection between the auxiliary electrode and the main electrode at the same time.

[19] According to another embodiment of the present invention, when an active-driving organic EL light emission device is made, there is used a method for manufacturing an active-driving organic EL light emission device comprising an organic EL element having an organic luminous medium between an upper electrode and a lower electrode, and a thin film transistor for driving the organic EL element, the method comprising the steps of forming the organic EL element and forming the thin film transistor, wherein during the step of forming the organic EL element, the lower electrode and the organic luminous medium are formed and subsequently a main electrode is formed from a transparent conductive material (embracing a transparent semiconductor material) and the upper electrode is formed by forming an electrically auxiliary electrode formed from a low-resistance material.

According to such an embodiment, it is possible to provide an active-driving organic EL light emission device wherein numerical aperture is large even if the TFT is disposed and further the sheet resistivity of the upper electrode is low even if luminescence is taken out from the side of the upper electrode.

DETAILED DESCRIPTION OF THE PREFERRED EMBODIMENTS

Figure 1:
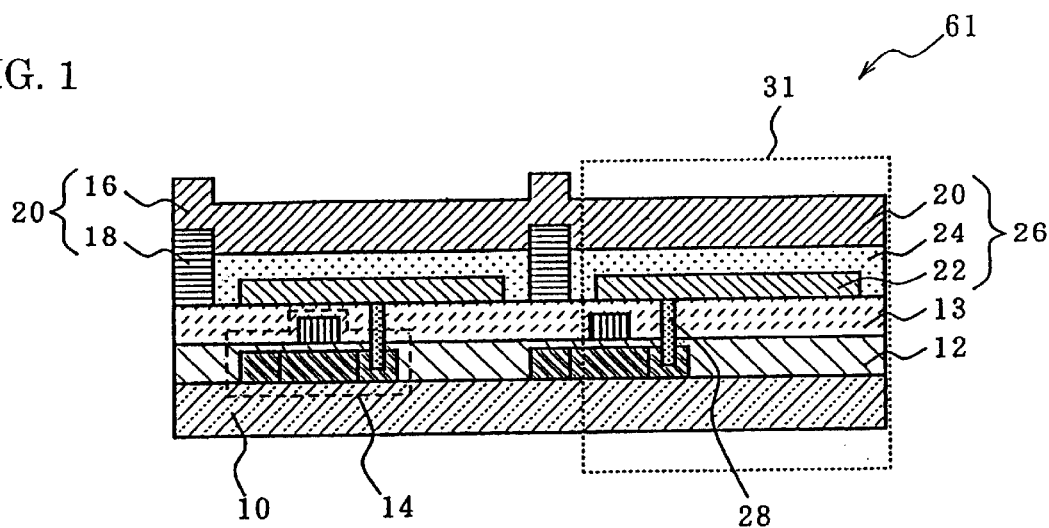
FIG. 1 is a sectional view of an active-driving organic EL light emission device in a first embodiment.

Embodiments of the present invention will be specifically described hereinafter, referring to the drawings. In the drawings for reference, the size and the shape of respective constituent components and the arrangement relationship thereof are merely illustrated schematically to such an extent that this invention can be understood. Therefore, this invention is not limited to the illustrated examples. In the drawings, hatching representing a section may be omitted.

[First Embodiment]

As illustrated in FIG. 1, an active-driving organic EL light emission device of a first embodiment is an active-driving organic EL light emission device 61 having, on a substrate 10, TFTs 14 embedded in an electrically insulating film 12, an interlayer insulating film (flattening film) 13 deposited on the TFTs 14, organic EL elements 26, each of which comprises an organic luminous medium 24 between an upper electrode 20 and a lower electrode 22, and electric connecting portions 28 for connecting the TFT 14 with the organic EL element 26.

In order to take out luminescence (EL light) of the organic EL element 26 and make the resistance of the upper electrode 20 low in the first embodiment, the upper electrode 20 comprises a main electrode 16 made of transparent conductive material and an auxiliary electrode 18 made of low-resistance material.

Figure 2:
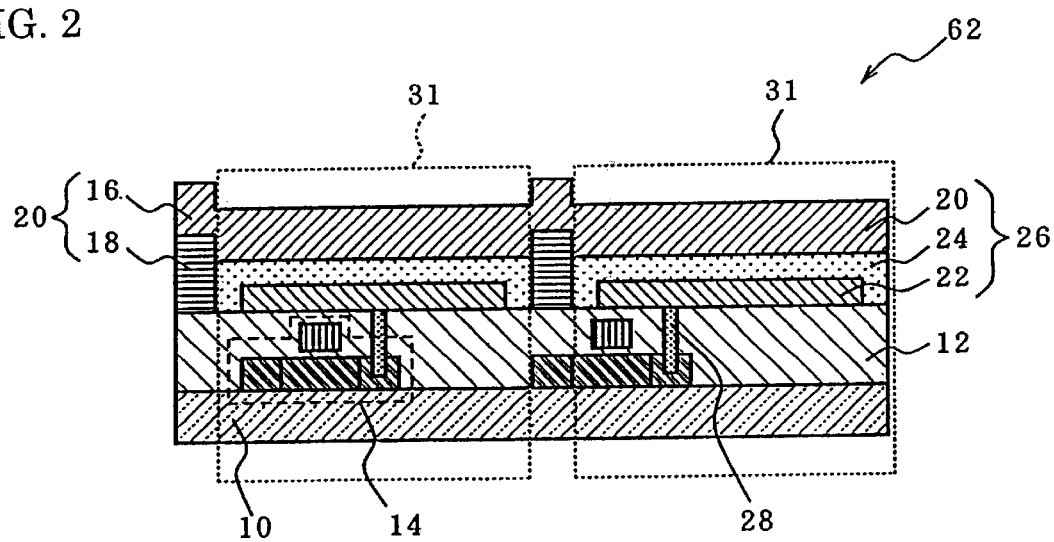
FIG. 2 is a sectional view of an example of an active-driving organic EL light emission device wherein an interlayer insulating film in the first embodiment is removed.

The following will describe constituent elements of the first embodiment, and the like, referring appropriately to FIG. 2.

FIG. 2 illustrates an active-driving organic EL light emission device 62 having a structure wherein the interlayer insulating film (flattening film) 13 illustrated in FIG. 1 is removed. In FIG. 2, the electrically insulating film 12 in which the TFTs 14 are embedded functions as the interlayer insulating film.

1. Substrate

The substrate (which may be referred to as a supporting substrate) in the organic EL display device is a member for supporting the organic EL element, the TFTs, and the like. Therefore, it is preferred that mechanical strength and dimensional stability thereof are superior.

Specific examples of such a substrate include glass substrates, metal substrates, ceramic substrates and plastic substrates (polycarbonate resin, acrylic resin, vinyl chloride resins, polyethylene terephthalate resin, polyimide resin, polyester resin, epoxy resin, phenol resin, silicone resin, fluorine resin and the like).

In order to avoid entry of water into the organic EL display device, it is preferred that the substrate made of such a material is subjected to moisture proof treatment or hydrophobic treatment, based on the formation of an inorganic film or the application of a fluorine resin.

In order to avoid entry of water into the organic luminous medium, it is particularly preferred that the water content and the gas permeability coefficient of the substrate are made small. Specifically, it is preferred to set the water content of the supporting substrate and the gas permeability coefficient thereof to 0.0001% or less by weight, and $1 \times 10^{-13}$ cc·cm/cm$^2$·sec. cmHg or less, respectively.

In order to take out EL light from the side opposite to the substrate, that is, the side of the upper electrodes in the present invention, the substrate does not necessarily needs to have transparency.

2. Organic EL Element (1) Organic Luminous Medium

The organic luminous medium can be defined as a medium comprising an organic luminous layer wherein an electron and a hole are recombined with each other so that EL light can be emitted. Such an organic luminous medium can be made, for example, by laminating the following respective layers on an anode.

① organic luminous layer
② hole injection layer/organic luminous layer
③ organic luminous layer/electron injection layer
④ hole injection layer/organic luminous layer/electron injection layer
⑤ organic semiconductor layer/organic luminous layer
⑥ organic semiconductor layer/electron barrier layer/organic luminous layer
⑦ hole injection layer/organic luminous layer/adhesion improving layer Among these structures, the structure of the ④ is preferably used in ordinary cases since the structure makes it possible to give a higher luminous brightness and is superior in endurance.

① Constituent Material

The luminous material in the organic luminous medium may be one or a combination of two or more selected from p-quarterphenyl derivatives, p-quinquephenyl derivatives, benzothiazole compounds, benzoimidazole compounds, benozoxazole compounds, metal-chelated oxinoid compounds, oxadiazole compounds, styrylbenzene compounds, distyrylpyrazine derivatives, butadiene compounds, naphthalimide compounds, perylene derivatives, aldazine derivatives, pyrazyline derivatives, cyclopentadiene derivatives, pyrrolopyrrole derivatives, styrylamine derivatives, coumalin compounds, aromatic dimethylidene compounds, metal complexes having an 8-quinolinol derivative as a ligand, and polyphenyl compounds.

Among these organic luminous materials, more preferred are 4,4'-bis(2,2-di-t-butylphenylvinyl)biphenyl (abbreviated to DTBPBBi), 4,4'-bis(2,2-diphenylvinyl)biphenyl (abbreviated to DPVBi) and derivatives thereof as the aromatic dimethylidene compounds.

It is also preferred to use a material wherein an organic luminous material having a distyrylarylene skeleton and the like, as a host material, is doped with an intensely fluorescent colorant having a color in from blue to red, as a dopant, for example, a coumalin type material or a fluorescent colorant that is equivalent to the host. More specifically, it is preferred to use the above-mentioned DPVBi and the like, as the host material, and 1,4-bis[{4-N,N'-diphenylamino}styryl]benzene (abbreviated to DPAVB), as the dopant.

It is preferred to use, for the hole injection layer in the organic luminous medium, a compound having a hole mobility of $1 \times 10^{-6}$ cm$^2$/V·second or more and an ionization energy of 5.5 eV or less. The hole mobility is measured in the case that a voltage of $1 \times 10^4$ to $1 \times 10^6$ V/cm is applied thereto. The deposit of such a hole injection layer makes injection of holes into the organic luminous layer satisfactory so that high luminous brightness can be obtained or low-voltage driving can be attained.

Specific examples of the constituent material of such a hole injection layer include organic compounds such as porphyrin compounds, aromatic tertiary amine compounds, styryl amine compounds, aromatic dimethylidene compounds, and condensed aromatic ring compounds, for example, 4,4'-bis[N-(1-naphtyl)-N-phenylamino]biphenyl (abbreviated to NPD) and 4,4',4''-tris[N-(3-methylphenyl)-N-phenylamino]triphenylamine (abbreviated to MTDATA).

As the constituent material of the hole injection layer, an inorganic compound such as p-type Si or p-type SiC is preferably used.

An organic semiconductor layer having a conductivity of $1 \times 10^{-10}$ S/cm or more is preferably arranged between the hole injection layer and an anode layer, or between the hole injection layer and the organic luminous layer. The arrangement of such an organic semiconductor layer makes injection of the holes into the organic luminous layer more satisfactory.

It is also preferred to use, for the electron injection layer in the organic luminous medium, a compound having an electron mobility of $1 \times 10^{-6}$ cm$^2$/V·second or more and an ionization energy of more than 5.5 eV. The electron mobility is measured in the case that a voltage of $1 \times 10^4$ to $1 \times 10^6$ V/cm is applied thereto. Deposit of such an electron injection layer makes injection of electrons into the organic luminous layer satisfactory so that high luminous brightness can be obtained or low-voltage driving can be attained.

Specific example of the constituent material of such an electron injection layer include a metal complex of 8-hydroxyquinoline (Al chelate: Alq), derivatives thereof or oxazole derivatives and the like.

The adhesion improving layer in the organic luminous medium may be regarded as one form of the electron injection layer, that is, a layer which is one of the electron injection layers and is made of a material that is particularly good in adhesiveness to the cathode. This layer is preferably made of a metal complex of 8-hydroxyquinoline, a derivative thereof and the like.

It is also preferred to deposit an organic semiconductor layer having a conductivity of $1 \times 10^{-10}$ S/cm or more to contact the electron injection layer. The deposit of such an organic semiconductor layer makes the injection of electrons into the organic luminous layer more satisfactory.

② Thickness

The thickness of the organic luminous medium is not particularly limited. It is preferred to set the thickness to a value within the range of, for example, 5 nm to 5 μm.

The reason for this is as follows. If the thickness of the organic luminous medium is below 5 nm, luminous brightness or endurance may be lowered. On the other hand, if the thickness of the organic luminous medium is over 5 μm, the value of applied voltage may be raised.

Accordingly, the thickness of the organic luminous medium is preferably set to a value within the range of 10 nm to 3 μm, and more preferably set to a value within the range of 20 nm to 1 μm.

(2) Upper Electrodes

① Structure 1

As shown in FIG. 1, in the first embodiment, the upper electrode 20 is characterized by being composed of the main electrode 16 comprising transparent conductive material, and the auxiliary electrode 18 comprising low-resistance material.

The sheet resistivity of the upper electrode 20 can be remarkably reduced by arranging not only the main electrode 16 but also the auxiliary electrode 18 comprising low-resistance material in the above-mentioned manner. Therefore, the organic EL element 26 can be driven at a low voltage and power consumption can be reduced.

The main electrode 16 shown in FIG. 1 is made of transparent conductive material, for example, a material having a transmissivity of 10% or more and preferably having a transmissivity of 60% or more. Therefore, EL light can be effectively taken out through the main electrode 16 to the outside. Thus, even if the TFT 14 and the like are set up, the aperture ratio of the pixels 31 can be made large.

② Structure 2

Figure 13:
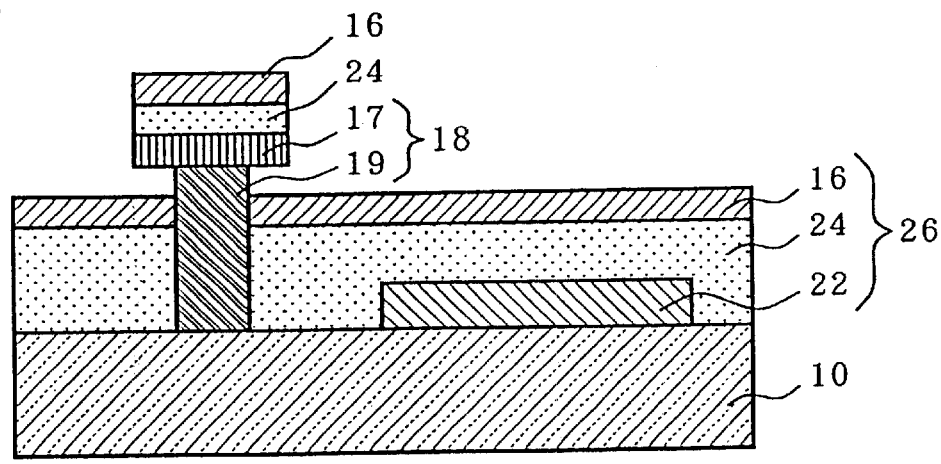
FIG. 13 is a sectional view of an auxiliary electrode (No. 1).
Figure 14:
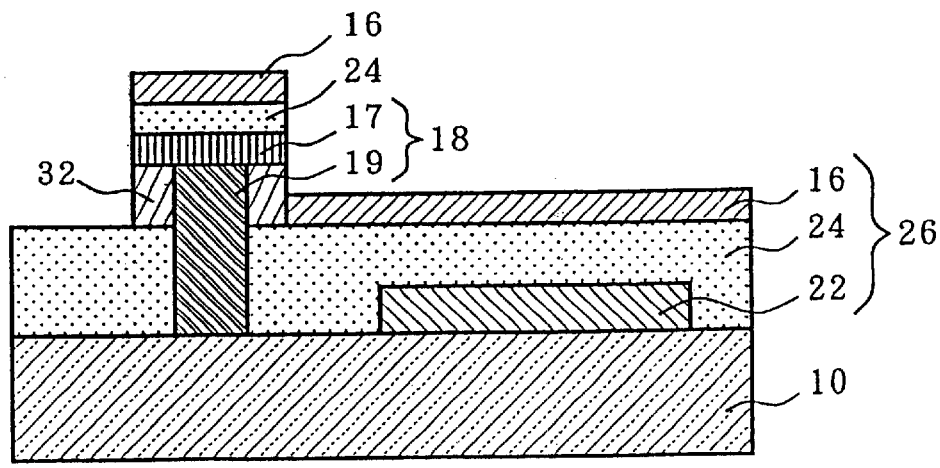
FIG. 14 is a sectional view of an auxiliary electrode (No. 2).
Figure 15A:
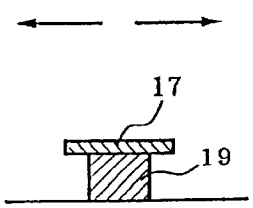
FIG. 15 is a sectional view of an auxiliary electrode (No. 3).
Figure 15B:
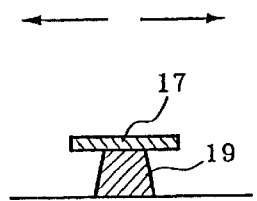
Figure 16C:
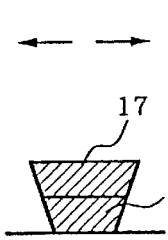
FIG. 16 is a sectional view of an auxiliary electrode (No. 4).
Figure 16D:
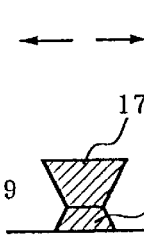
Figure 16E:
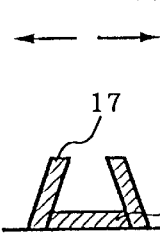
Figure 16F:
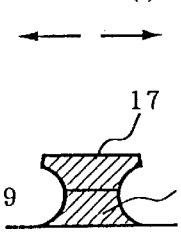
Figure 16G:
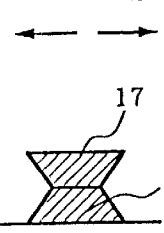
Figure 16H:
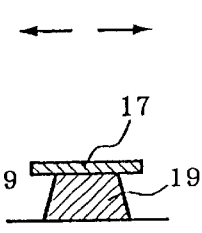

As shown in FIGS. 13 to 15, about the structure of the auxiliary electrode 18 in the upper electrode 20, the auxiliary electrode 18 is preferably composed of an upper auxiliary electrode 17 and a lower auxiliary electrode 19.

Such a structure makes it possible to connect the lower auxiliary electrode 19 electrically to the main electrode 16 even if the upper auxiliary electrode 17 is electrically insulated. Contrarily, even if the lower auxiliary electrode 19 is electrically insulated, the upper electrode 17 can be connected electrically to the main electrode 16.

Such a structure also makes it possible to use different constituent materials to make the respective electrodes. Therefore, the electrical connection between the auxiliary electrode 18 and the main electrode 16 is made more certain. In the case that the main electrode 16 is electrically connected to the upper auxiliary electrode 17 comprising a metal material through the lower auxiliary electrode 19 comprising a semiconductor material having relatively good capability of connecting any transparent oxide conductive material as well as any metal, for example, an indium zinc oxide (IZO) as an amorphous inorganic oxide, the electrical connection between the auxiliary electrode 18 and the main electrode 16 is made more certain than, for example, in the case that the main electrode 16 comprising a transparent oxide conductive material is electrically connected directly to the auxiliary electrode 18 comprising a metal material.

Furthermore, such a structure makes it possible to use constituent materials having different etching properties to make the respective auxiliary electrodes. Therefore, the sectional shape of the auxiliary electrode 18 can easily be made into an overhang form as described below.

③ Structure 3

As shown in FIGS. 13 to 16, about the structure of the auxiliary electrode 18 in the upper electrode 20, the sectional shape of the auxiliary electrode 18 is preferably made into an overhang form.

The reason for this is that the auxiliary electrode can be electrically connected to the main electrode 16 through the overhanging lower portion even if an insulating film is deposited on the auxiliary electrode 18.

Specifically, if after the formation of the auxiliary electrode 18 an insulating film or an organic luminous medium is formed by vapor deposition and the like and further the main electrode 16 is formed, the insulating film covers the auxiliary electrode 18 so that it may become difficult to connect the auxiliary electrode 18 electrically to the main electrode 16.

On the other hand, in the case that the sectional shape of the auxiliary electrode 18 is in the overhang form, an insulating film, even when being deposited by vapor-deposition and the like, is not easily adhered to the side of the auxiliary electrode 18. Using this naked side of the auxiliary electrode 18, electrical connection to the main electrode 16 can be made sure.

For example, in FIG. 14, the upper electrode 17 is electrically insulated by the organic luminous medium 24 and the like while the lower electrode 19 is electrically connected to the main electrode 16. This demonstrates connection-easiness of the auxiliary electrode 18 originating from this structure.

The sectional shape of the auxiliary electrode 18 can easily be made into an overhang form by composing the auxiliary electrode 18 of the lower and upper electrodes 19 and 17 and making the two electrodes 19 and 17 from constituent materials having different etching rates. Specifically, it is preferred to make the lower auxiliary electrode 19 from a metal material such as Al or Al alloy, and make the upper auxiliary electrode 17 from a non-metal material such as silica, alumina, Si nitride, Cr nitride, Ta nitride or W nitride.

The lower auxiliary electrode 19 and the upper auxiliary electrode 17 are made from, for example, Al and Cr, respectively, and Cr is etched with an ammonium cerium nitrate solution in a photolithographic manner. Thereafter, Al is further etched with a mixed solution of phosphoric acid, nitric acid, and acetic acid, so that only Al of the lower auxiliary electrode 19 is over-etched. Thus, an overhang can easily be obtained.

Examples of such an overhang are shown in FIGS. 13 to 16. The overhang may have various shapes. It is allowable to use the auxiliary electrode 18 in an overhang form having a bilayer structure composed of the lower auxiliary electrode 19 and the upper auxiliary electrode 17, and as shown in FIG. 16(e), an auxiliary electrode 18 in an overhang form having a three-layer structure.

Arrows in FIGS. 13 to 16 represent the projecting direction of the overhangs.

④ Structure 4

As shown in FIG. 4, about the structure of the auxiliary electrodes 18 in the upper electrode 20, it is preferred that the auxiliary electrodes 18, when are viewed from the above, are regularly placed in a plane.

This makes it possible to make the ohmic value of the upper electrodes highly and uniformly low. The regularly placement of the auxiliary electrodes 18 makes the production thereof easy.

⑤ Structure 5

As shown in FIGS. 1 and 2, about the structure of the auxiliary electrodes 18 in the upper electrode 20, it is preferred that the auxiliary electrode 18, when viewed from the above, is arranged between the lower auxiliary electrodes 22 adjacent to each other. This is demonstrated by, for example, arrangement of the auxiliary electrode 18 between adjacent pixels 31 drawn by dot lines in FIG. 2.

In short, such arrangement of the auxiliary electrode 18 makes it possible to obtain a higher luminous brightness without making the numerical aperture of the pixels 31 narrow.

Figure 5:
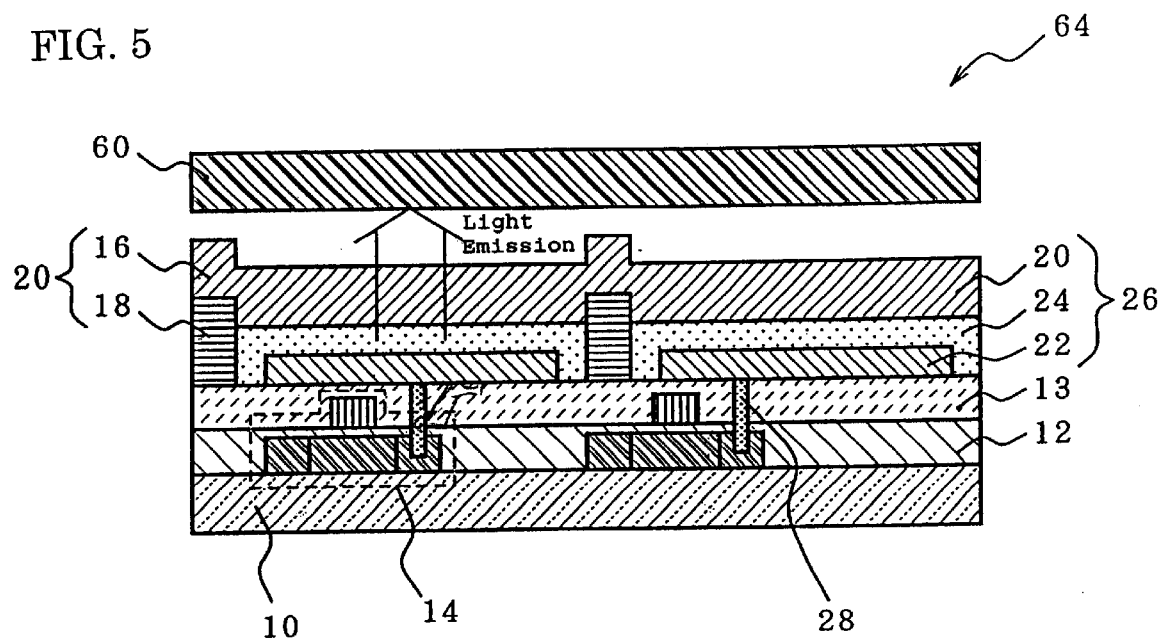
FIG. 5 is a sectional view of an active-driving organic EL light emission device in a second embodiment.

It is preferred as another arrangement of the auxiliary electrodes 18 that in the case that a color filter or a fluorescent film 60 shown in FIG. 5 is arranged and further a black matrix (light shading portions) is arranged in perpendicular direction positions corresponding to the gaps between lower electrodes 22, the auxiliary electrodes 18 are arranged in the manner that the light shading portion of the black matrix and the auxiliary electrode overlap with each other in the perpendicular direction.

Such a structure does not make the aperture ratio of pixels narrow even if the black matrix is arranged and makes it possible to prevent reflection light on the auxiliary electrodes effectively.

⑥ Structure 6

As shown in FIGS. 1 and 2, about the structure of the auxiliary electrodes 18 in the upper electrode 20, it is preferred that the auxiliary electrodes 18 are deposited on the electrically insulating film 12 for insulating the TFTs 14 and the interlayer insulating film (flattening film) 13, or either one of the insulating film 12 or 13.

Such a structure makes it possible to reduce electric capacity made between the auxiliary electrode and wiring related to the TFT. Thus, switching operation of the organic EL elements can become fast.

Figure 3:
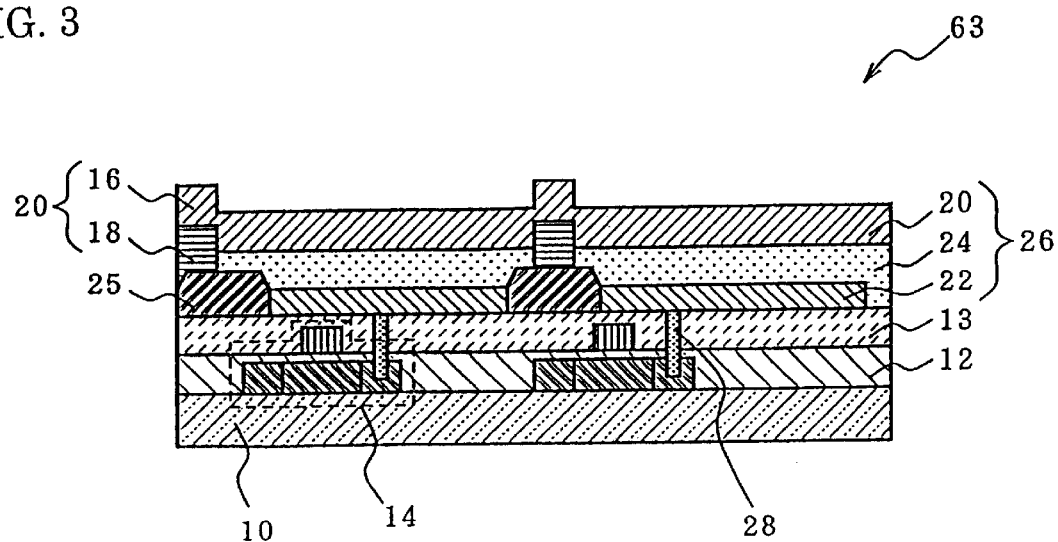
FIG. 3 is a sectional view of an example wherein the arrangement of auxiliary electrodes in the first embodiment is modified (No. 1).
Figure 4A:
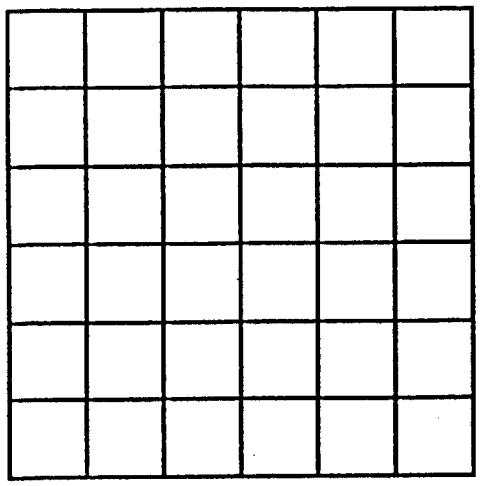
FIG. 4 is a schematic view of an example wherein the auxiliary electrodes in the first embodiment are regularly placed.
Figure 4B:
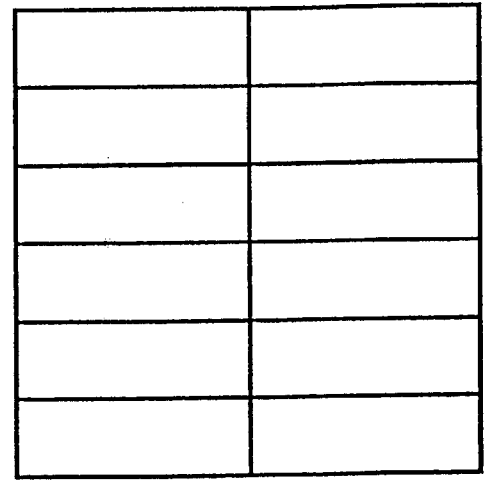
Figure 4C:
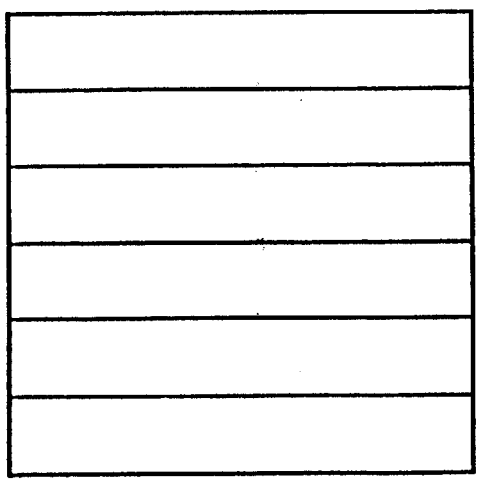
Figure 4D:
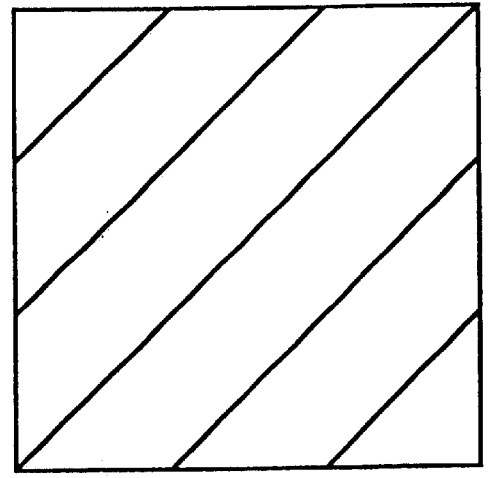

Further, as shown in FIG. 3, as another arrangement of the auxiliary electrodes 18, it is preferred that an electrically insulating film 25, which is different from the interlayer insulating film 13, is arranged between adjacent lower electrodes 22 and the auxiliary electrodes 18 are formed on the insulating film 25.

Such a structure makes it possible to reduce a short circuit between the lower electrode 22 and the upper electrode 20 that is caused in a step of the lower electrode 22, or a leakage. Thus, image defects can be reduced.

Figure 6:
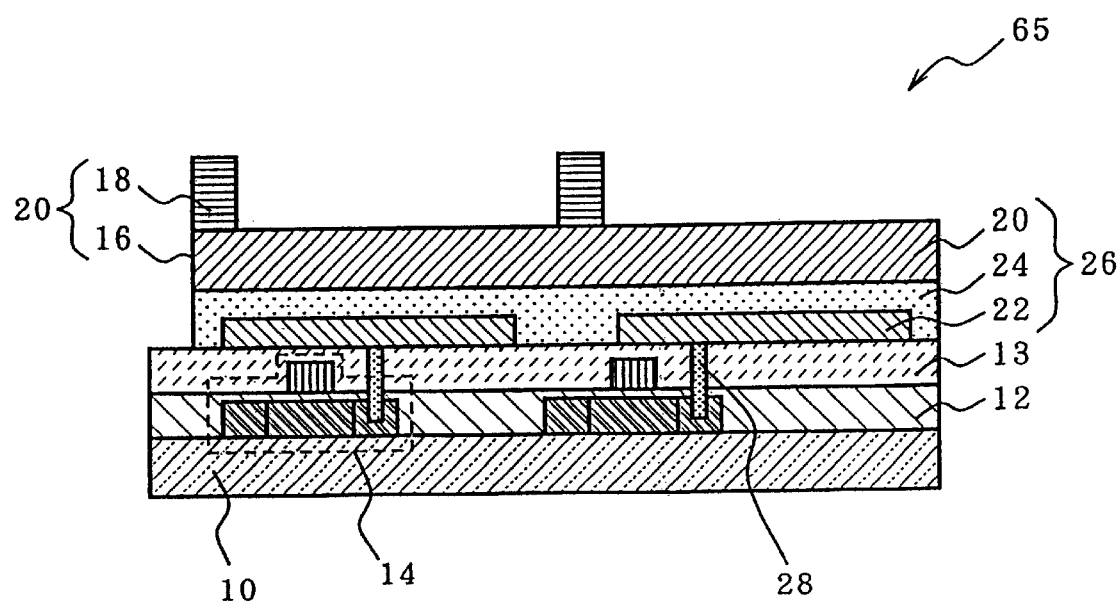
FIG. 6 is a sectional view of an example wherein the arrangement of auxiliary electrodes in the first embodiment is modified (No. 2).

As shown in FIG. 6, as the arrangement of the auxiliary electrodes 18, it is preferred that the auxiliary electrodes 18 are formed on the main electrodes 16 and the area of the auxiliary electrodes 18 is made smaller than that of the main electrodes 16.

Such a structure does not make the aperture ratio of pixels narrow, and makes it easy to form the auxiliary electrodes and adjust the sheet resistivity of the auxiliary electrodes.

Needless to say, the structure 6 about the arrangement relative to the interlayer insulating film and the like satisfies the arrangement of the structure 5 since the auxiliary electrode 18 is arranged between the adjacent lower electrodes 22.

⑦ Constituent Material 1

The upper electrode 20 (the main electrode 16 and the auxiliary electrode 18) in FIG. 1 and the like corresponds to an anode layer or a cathode layer dependently on the structure of the organic EL element. In the case of the anode layer, a constituent material having a large work function, for example, a work function of 4.0 eV or more is preferably used since holes are easily injected therein. In the case of the cathode layer, a constituent material having a small work function, for example, a work function of less than 4.0 eV is preferably used since electrons are easily injected therein.

On the other hand, in order to take out luminescence to the outside in the first embodiment, it is essential that the constituent material of the main electrode 16 in the upper electrode 20 has given transparency.

Thus, in the case that the upper electrode 20 corresponds to the anode layer, the constituent material of the main electrode 16 may be specifically one or a combination of two or more selected from indium tin oxide (ITO), indium zinc oxide (IZO), copper iodide (CuI), tinoxide ($SnO_2$), zinc oxide (ZnO), antimony oxide ($Sb_2O_3$, $Sb_2O_4$, and $Sb_2O_5$), aluminum oxide ($Al_2O_3$) and the like.

In order to make the resistance of the main electrode 16 low without damaging the transparency thereof, it is preferred to add one or a combination of two ore more selected from Pt, Au, Ni, Mo, W, Cr, Ta, Al metal and the like in the form of the thin film.

In the first embodiment, the sheet resistivity of the upper electrode 20 can be reduced by not only the transparent material but also the auxiliary electrode 18. For the main electrode 16, therefore, at least one constituent material can be selected from light transparent metal films, non-degenerate semiconductors, organic conductors, semiconductive carbon compounds and the like.

For example, for the organic conductor, preferred is a conductive conjugated polymer, an oxidizing agent-added polymer, a reducing agent-added polymer, an oxidizing agent-added low-molecule, or a reducing agent-added low-molecule.

The oxidizing agent added to the organic conductor may be a Lewis acid such as iron chloride, antimony chloride or aluminum chloride. The reducing agent added to the organic conductor may be an alkali metal, an alkali earth metal, a rare earth metal, an alkali compound, an alkali earth compound, a rare earth metal compound, and the like. The conductive conjugated polymer may be polyaniliine or a derivative thereof, polythiophene or a derivative, a Lewis acid added amine compound layer, and the like.

Preferred specific examples of the non-degenerate semiconductor include oxides, nitrides, and chalcogenide compounds.

Preferred specific examples of the carbon compound include amorphous C, graphite, and diamond-like C.

Preferred specific examples of the inorganic semiconductor include ZnS, ZnSe, ZnSSe, MgS, MgSSe, CdS, CdSe, CdTe and CdSSe and the like.

⑧ Constituent Material 2

It is necessary that the auxiliary electrode 18 shown in FIG. 1 and the like is made of low-resistance material. It is preferred to use low-resistance material having a specific resistance within the range of, for example, $1\times10^{-5}$ to $1\times10^{-3}$ Ω·cm.

The reason for this is as follows. A material having a specific resistance of less than $1\times10^{-5}$ Ω·cm cannot be easily realized. On the other hand, if the specific resistance is over $1\times10^{-3}$ Ω·cm, it may be difficult to make the resistance of the upper electrode low.

Therefore, the specific resistance of the low-resistance material constituting the auxiliary electrode is more preferably set to a value within the range of $2\times10^{-5}$ to $5\times10^{-4}$ Ω·cm, and still more preferably set to a value within the range of $2\times10^{-5}$ to $1\times10^{-4}$ Ω·cm.

The sheet resistivity of the auxiliary electrode 18 is preferably set to a value within the range of 0.01 to 10 Ω/□. The reason for this is as follows. If the sheet resistivity is below 0.01 Ω/□, it may be necessary to make the upper electrode thick or the material for use may be excessively restricted. On the other hand, the sheet resistivity is over 10 Ω/□, the resistance of the upper electrode may not be easily made low or the upper electrode becomes too thin to be formed. Therefore, the sheet resistivity of the auxiliary electrode is more preferably set to a value within the range of 0.01 to 10 Ω/□ and still more preferably set to a value within the range of 0.01 to 5 Ω/□.

As a preferred low-resistance material constituting the auxiliary electrode 18, various metals used in wiring electrodes are preferably used. Specifically, it is preferred to contain one or a combination of two or more selected from Al, alloys of Al and a transition metal (Sc, Nb, Zr, Hf, Nd, Ta, Cu, Si, Cr, Mo, Mn, Ni, Pd, Pt and W and the like), Ti, titanium nitride (TiN), and the like.

Such low-resistance material is more preferably Al or an alloy of Al and a transition metal. In the case that an alloy of Al and a transition metal is used, the content by percentage of the transition metal is preferably 10% or less by atom (referred to as at. % or atm %), more preferably 5% or less by atom, and still more preferably 2% or less by atom. This is because as the transition metal content is smaller, the sheet resistivity of the auxiliary electrode can be made lower.

In the case that the above-mentioned metal is used as the main component, the amounts of used Al, Ti and TiN are preferably 90–100% by atom, 90–100% by atom, and 90–100% by atom, respectively.

When two or more of these metals are used, the blend ratio thereof is arbitrary. The Ti content is 10% or less by atom is preferred, for example, when a mixture of Al and Ti is used.

Furthermore, plural layers comprising these metals may be laminated to make the auxiliary electrode 18.

⑨ Thickness

The thicknesses of the main electrode 16 and the auxiliary electrode 18 shown in FIG. 1 and the like is preferably decided under consideration of the sheet resistivity and the like. Specifically, the thickness of each of the main electrode 16 and the auxiliary electrode 18 is preferably a value of 50 nm or more, more preferably a value of 100 nm or more, and still more preferably a value within the range of 100 to 5,000 nm.

The reason for this is as follows. Setting the thickness of the main electrode 16 and the auxiliary electrode 18 to a value within such a range makes it possible to obtain a uniform thickness distribution and a transmissivity of 60% or more about light emission (EL light). Moreover, the sheet resistivity of the upper electrode 20 comprising the main electrode 16 and the auxiliary electrode 18 can be made to 15 Ω/□ or less, and more preferably 10 Ω/□ or less.

(3) Lower Electrode

① Constituent Material

The lower electrode 22 shown in FIG. 1 and the like also corresponds to an anode layer or a cathode layer dependently on the structure of the organic EL display device. When the lower electrode 22 corresponds to, for example, a cathode, it is preferred to use a metal, alloy or electrically conductive compound which has a small work function (for example, less than 4.0 eV), a mixture thereof, or a substance containing it.

Specifically, a single or a combination of two or more selected from the following electrode materials is preferably used: sodium, sodium-potassium alloys, cesium, magnesium, lithium, magnesium-silver alloys, aluminum, aluminum oxides, aluminum-lithium alloys, indium, rare earth metals, mixture of any one of these metals and an organic luminous medium material, mixtures of any one of these metals and an electron injection layer material, and the like.

Moreover, since luminescence is taken out from the side of the upper electrodes 20 in the present invention, the constituent material of the lower electrodes 22 does not necessarily need to have transparency. In a preferred embodiment, the lower electrode is made of a light-absorbing conductive material. Such a structure makes it possible to improve contrast of the organic EL display device still more. Preferred examples of the light-absorbing conductive material in this case include semiconductive carbon materials, organic compounds having a color, combinations of the above-mentioned reducing agent and oxidizing agent, and conductive oxides having a color (transition metal oxides such as $VO_x$, $MoO_x$ and $WO_x$).

② Thickness

In the same way as for the upper electrode 20, the thickness of the lower electrode 22 is not particularly limited, either. Specifically, the thickness is preferably a value within the range of 10 to 1,000 nm, and more preferably a value within the range of 10 to 200 nm.

(4) Interlayer Insulating Film

The interlayer insulating film (electrically insulating film) 13 in the organic EL display device 61 shown in FIG. 1 is present near or around the organic EL element 26, and is used to make the whole of the organic EL display device 61 minute and prevent a short circuit between the lower electrode 22 and the upper electrode 20 in the organic EL element 26. When the organic EL element 26 is driven by the TFT 14, the interlayer insulating film 13 is also used as an undercoat for protecting the TFT 14 and for depositing the lower electrode 22 of the organic EL element 26 flatly.

For this reason, the interlayer insulating film 13 may be referred to as a different name such as a barrier, a spacer, or a flattening film, if necessary. In the present invention, the interlayer insulating film embraces them.

① Constituent Material

Examples of the constituent material used in the interlayer insulating film 13 shown in FIG. 1 usually include acrylic resin, polycarbonate resin, polyimide resin, fluorinated polyimide resin, benzoguanamine resin, melamine resin, cyclic polyolefin, Novolak resin, polyvinyl cinnamate, cyclic rubber, polyvinyl chloride resin, polystyrene, phenol resin, alkyd resin, epoxy resin, polyurethane resin, polyester resin, maleic acid resin, and polyamide resin and the like.

In the case that the interlayer insulating film is made of an inorganic oxide, preferred examples of the inorganic oxide include silicon oxide ($SiO_2$ or $SiO_x$), aluminum oxide ($Al_2O_3$ or $AlO_x$), titanium oxide ($TiO_2$ or $TiO_x$), yttrium oxide ($Y_2O_3$ or $YO_x$) germanium oxide ($GeO_2$ or $GeO_x$), zinc oxide (ZnO), magnesium oxide (MgO), calcium oxide (CaO), boric acid ($B_2O_3$), strontium oxide (SrO), barium oxide (BaO), lead oxide (PbO), zirconia ($ZrO_2$), sodium oxide ($Na_2O$), lithium oxide ($Li_2O$), and potassium oxide ($K_2O$). The value x in the inorganic compound is a value within the range of $1 \leq x \leq 3$.

In the case that heat-resistance is particularly required, it is preferred to use acrylic resin, polyimide resin, fluorinated polyimide, cyclic polyolefin, epoxy resin, or inorganic oxide.

These interlayer insulating films, when being organic, can be worked into a desired pattern by introducing a photosensitive group thereto and using photolithography method, or can be formed into a desired pattern by printing.

② Thickness of the Interlayer Insulating Film, and the Like

The thickness of the interlayer insulating film depends on the minuteness of display, a fluorescent medium combined with the organic EL element, or unevenness of a color filter, and is preferably a value within the range of 10 nm to 1 mm.

This is because such a structure makes it possible to make the unevenness of the TFT and the like sufficiently flat.

Accordingly, the thickness of the interlayer insulating film is more preferably a value within the range of 100 nm to 100 μm, and still more preferably a value within the range of 100 nm to 10 μm.

③ Forming Method

The method for forming the interlayer insulating film is not particularly limited. The layer is preferably deposited by, for example, spin coating method, casting method, screen-printing method and the like, or is preferably deposited by sputtering method, vapor-deposition method, chemical vapor deposition method (CVD method), ion plating method, and the like.

3. Thin Film Transistor (TFT)

(1) Structure

Figure 9:
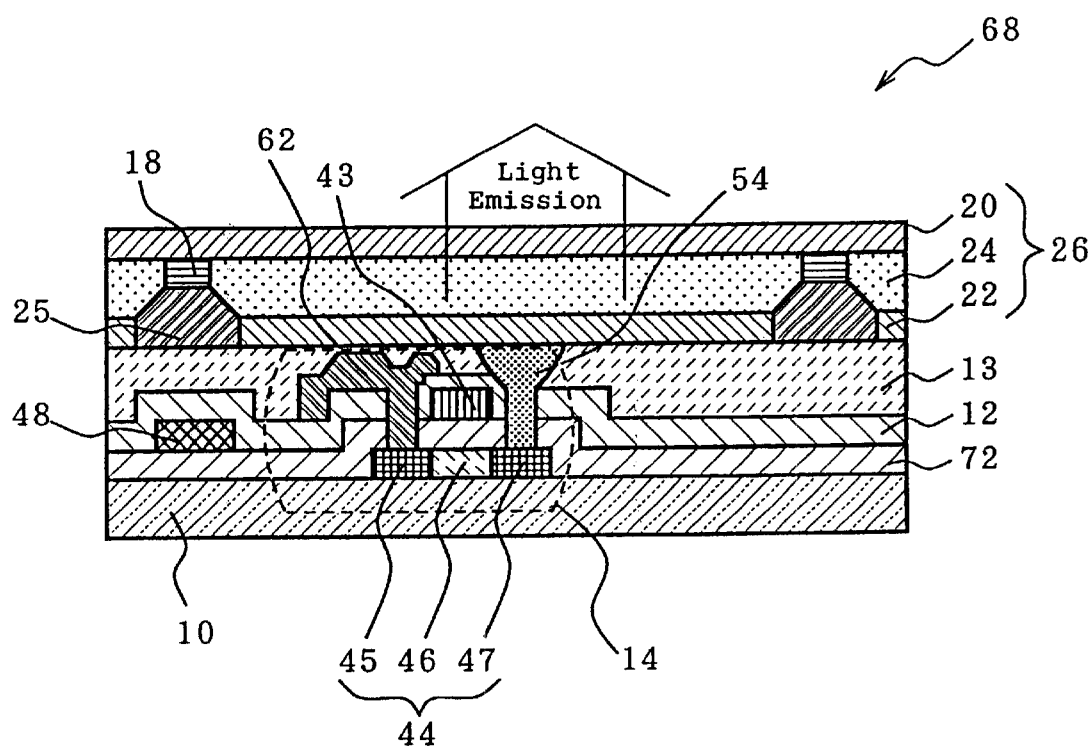
FIG. 9 is a view supplied for explanation of a TFT.

As shown in FIG. 9, one example of the organic active EL light emission device 68 has, on a substrate 10, a TFT 14 and an organic EL element 26 driven by this TFT 14.

An interlayer insulating film 13 whose surface (upper surface) is made flat is arranged between the TFT 14 and a lower electrode 22 of the organic EL element 26. A drain 47 of the TFT 14 and the lower electrode 22 of the organic EL element 26 are electrically connected to each other through a contact hole 54 made in this interlayer insulating film 13.

Figure 10:
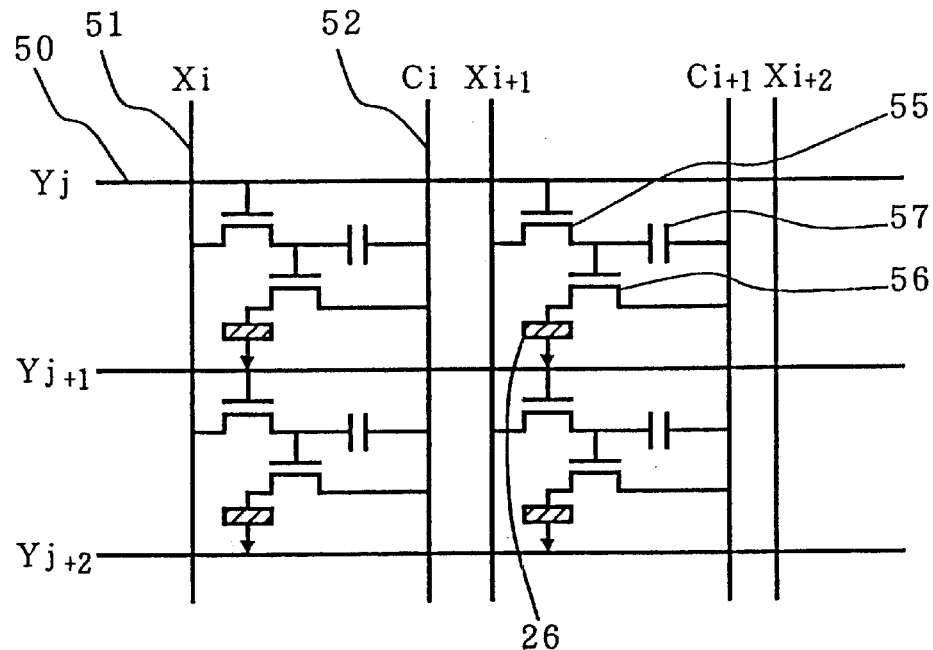
FIG. 10 is a circuit diagram of an example of an active-driving organic EL light emission device.
Figure 11:
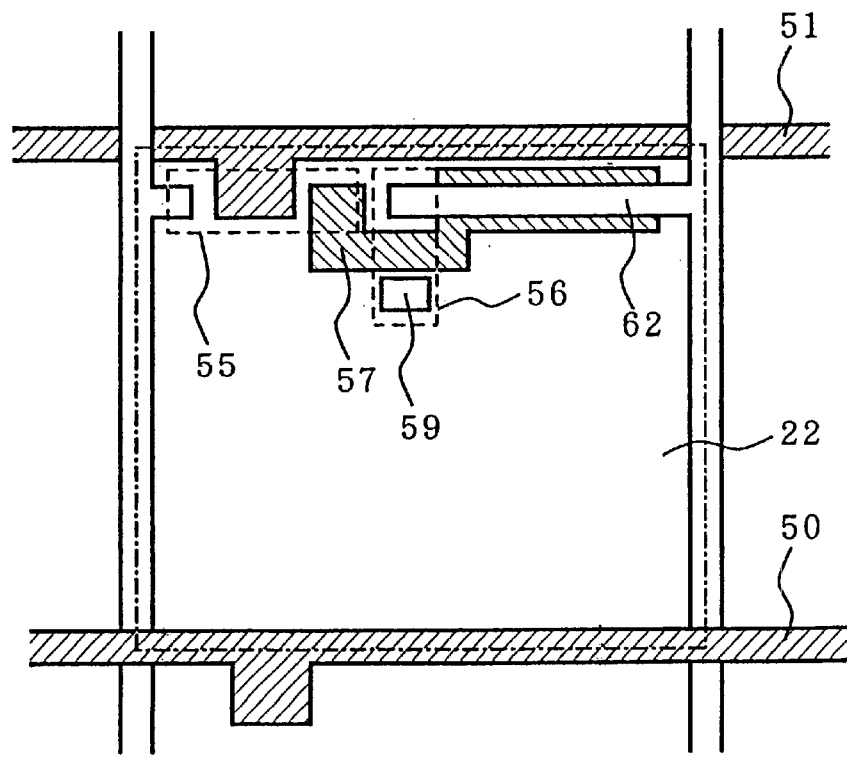
FIG. 11 is a seeing-through view of an active-driving organic EL light emission device according to the circuit diagram shown in FIG. 10 along its plan direction.

As shown in FIG. 10, scanning electrode lines (Yj—Yj+n) 50 and signal electrode lines (Xi—Xi+n) 51 arranged in an XY matrix are electrically connected to the TFT 14. Furthermore, common electrode lines (Ci—Ci+n) 52 are electrically connected in parallel to the TFTs 14.

It is preferred that these electrode lines 50, 51 and 52 are electrically connected to the TFT 14 and they, together with a capacitance 57, constitute an electric switch for driving the organic EL element 26. Specifically, it is preferred that this electric switch is electrically connected to the scanning electrode line, the signal electrode line and the like, and comprises, for example, at least one first transistor (which may be referred to as Tr1 hereinafter) 55, a second transistor (which may be referred to as Tr2 hereinafter), and the capacitance 57.

It is preferred that the first transistor 55 has a function for selecting a luminous pixel and the second transistor 56 has a function for driving the organic EL element.

As shown in FIG. 9, an active layer 44 in the first transistor (Tr1) 55 and the second transistor (Tr2) 56 is a portion shown as n+/i/n+. It is preferred that the two sides n+ are composed of semiconductor regions 45 and 47 doped into the n type and i therebetween is composed of a non-doped semiconductor region 46.

The semiconductor regions doped with the n type are a source 45 and the drain 47, respectively. They, together with a gate 46 deposited through a gate oxide film on the non-doped semiconductor region, constitute the first and second transistors 55 and 56.

In the active layer 44, the semiconductor regions 45 and 47 doped into the n type may be doped into the p type, instead of the n type, so as to make a structure of p+/i/p+.

The active layer 44 in the first transistor (Tr1) 55 and the second transistor (Tr2) 56 is preferably made of an inorganic semiconductor such as polysilicon or an organic semiconductor such as thiophene oligomer or poly(P-phenylenevinylene). Polysilicon is a particularly preferred material since it is far more stable against electricity than amorphous Si (α-Si).

Figure 17:
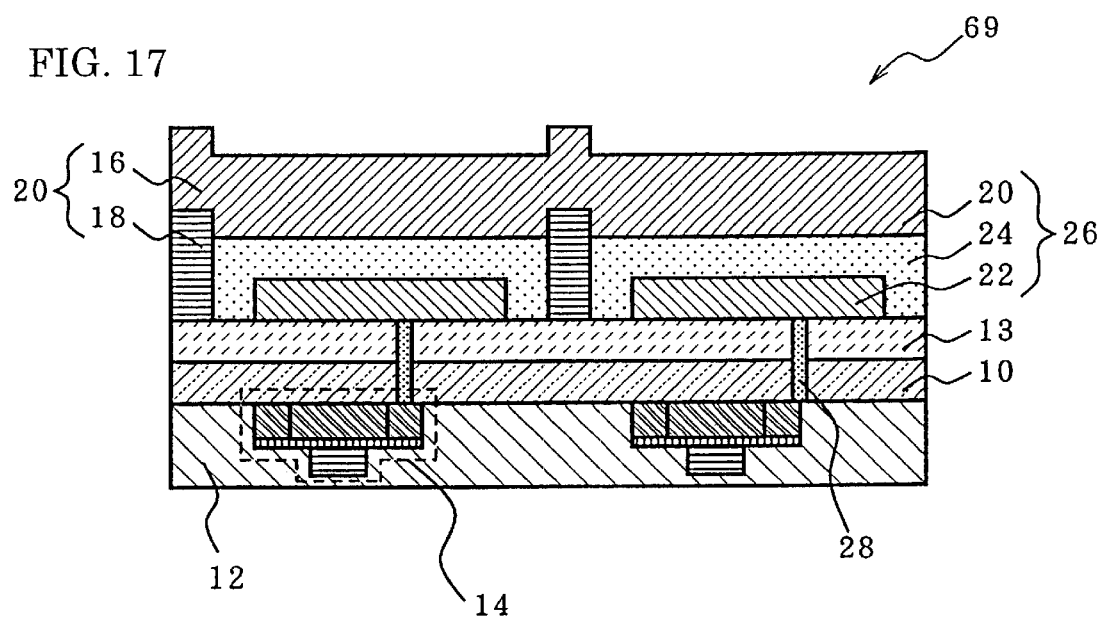
FIG. 17 is a sectional view of a modification example of the active-driving organic EL light emission device in the first embodiment.
Figure 18:
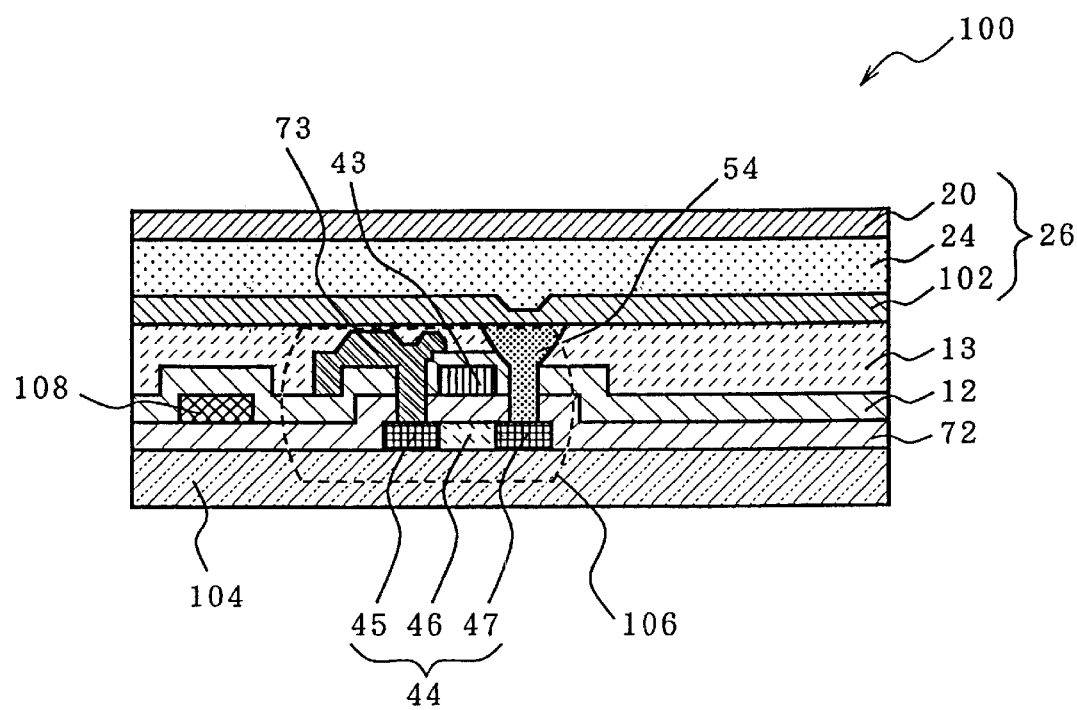
FIG. 18 is a sectional view of a conventional active-driving organic EL light emission device (No. 1).
Figure 19:
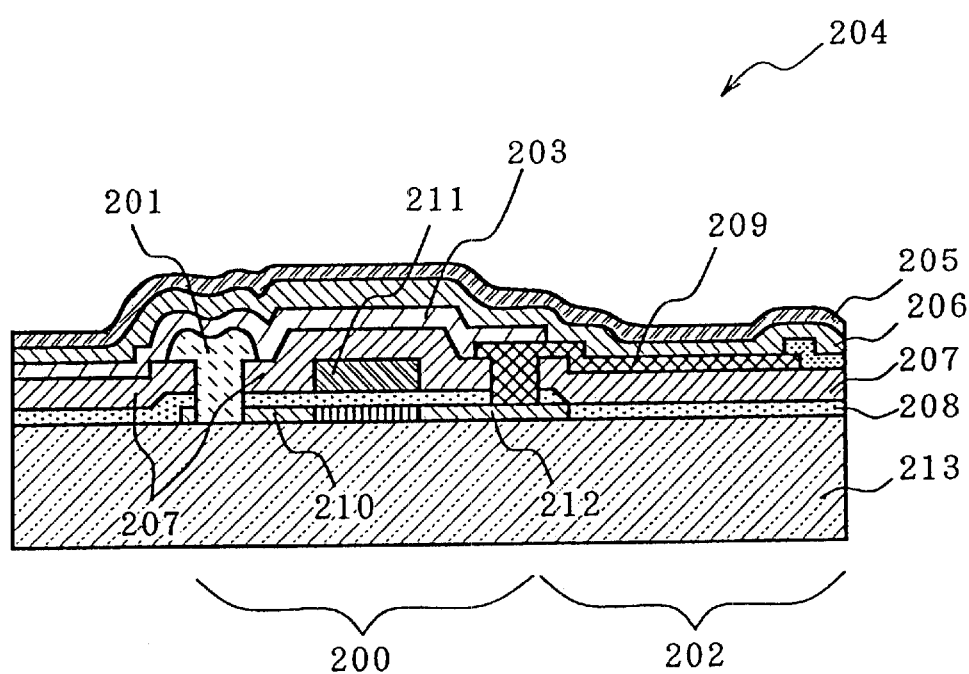
FIG. 19 is a sectional view of a conventional active-driving organic EL light emission device. It is a sectional view of an auxiliary electrode (No. 2).

Besides, the organic EL element 26 is deposited through the interlayer insulating film (flattening film) 13 on the TFT 14 formed on the surface of the substrate 10 in the examples shown in FIGS. 1 and 9. As shown in FIG. 17, it is also preferred to form the TFT on the back surface of the substrate, form the organic EL element on the surface of the substrate and connect the TFT 14 and the lower electrode of the organic EL element 26 electrically to each other through a via hole 28 made in the substrate 10 and the interlayer insulating film (flattening film) 13.

Such a structure makes it possible to keep better electrical insulation between the TFT 14 and the organic EL element 26. In this example, the interlayer insulating film(flattening film) 13 is deposited on the substrate 10. However, the interlayer insulating film 13 may be omitted since both surfaces of the substrate 10 have superior flatness.

(2) Driving Method

The following will describe the method for driving the organic EL element by the TFT 14. As shown in FIG. 10, the TFT 14 comprises the first transistor (Tr1) 55 and the second transistor (Tr2) 56, and further the TFT combined with the capacitance 57 constitutes a part of the electric switch.

Therefore, a scanning pulse and a signal pulse are inputted through the XY matrix to this electric switch to perform switch operation, so that the organic EL element 26 connected to this electric switch can be driven. Thus, light emission from the organic EL element 26 is caused or stopped by the electric switch comprising the TFT 14 and the capacitance 57, so that an image can be displayed.

Specifically, a desired first transistor 55 is selected by a scanning pulse transmitted through the scanning electrode line (which may be referred to as a gate line) (Yj—Yj+n) 50 and a signal pulse transmitted through the signal electrode line (Xi—Xi+n) 51, so as to supply given electrical charges to the capacitance 57 formed between the common electrode line (Ci—Ci+n) 52 and the source 45 of the first transistor (Tr1) 55.

In this way, the gate voltage of the second transistor (Tr2) 56 turns into a constant value and the second transistor (Tr2) 56 turns into an ON state. Since in this ON state the gate voltage is held at a given value until a next gate pulse is transmitted, electric current continues to be supplied to the lower electrode 22 connected to the drain 47 of the second transistor (Tr2) 56.

The organic EL element 26 is effectively driven by direct-current supplied through the lower electrode 22. Thus, by the effect of the direct-current driving, the driving voltage for the organic EL element 26 can be highly reduced and the luminous efficiency thereof is improved. Moreover, power consumption can be reduced.

[Second Embodiment]

As shown in FIG. 5, the active-driving organic EL light emission device of the second embodiment is an active-driving organic EL light emission device 64 comprising, on the substrate 10, the TFT 14 embedded in the electrically insulating film 12, the organic EL element 26 comprising the organic luminous medium 24 between the upper electrode 20 and the lower electrode 22, and the electrically connecting portion (via hole) 28 for connecting the TFT 14 and the organic EL element 26 to each other.

The second embodiment is characterized in that, the upper electrode 20 is composed of the main electrode 16 and the auxiliary electrode 18, and further above the upper electrode 20 is set up a color filter or fluorescent film 60 for color-converting EL light taken out from the side of the upper electrode 20. (An arrow in FIG. 5 represents a direction along which the light is taken out.).

The following will describe the characteristic parts and the like of the second embodiment, referring appropriately to FIG. 5.

(1) Color Filter

① Structure

The color filter is set up to decompose or cut light to improve color adjustment or contrast, and comprises a colorant layer consisting only of a colorant, or a lamination wherein a colorant is dissolved or dispersed in a binder resin. The colorant referred to herein embraces a pigment.

The structure of the color filter preferably comprises a blue, green or red colorant. Combination of such a color filter with the organic EL element emitting white light makes it possible to obtain three primary colors of light, that is, blue, green and red, and to attain full-color display.

The color filter is preferably patterned by printing method or photolithography method in the same manner as for the fluorescence medium.

② Thickness

The thickness of the color filter is not particularly limited so far as the thickness causes sufficient receipt (absorption) of luminescence from the organic EL element and does not damage color-converting function. The thickness is preferably, for example, a value within the range of 10 nm to 1 mm, more preferably a value within the range of 0.5 $\mu$m to 1 mm, and still more preferably a range within the range of 1 $\mu$m to 100 $\mu$m.

(2) Fluorescent Medium

① Structure

The fluorescent medium in the organic EL display device has a function for absorbing luminescence from the organic EL element and emitting fluorescence having a longer wavelength, and comprises layer-form matters separated and arranged in a plane. The respective fluorescent medium are preferably arranged correspondingly to luminescence areas of the organic EL elements, for example, positions where the lower electrode and the upper electrode cross each other. When the organic luminous layer at the portion where the lower electrode and the upper electrode cross each other emits light, such a structure makes it possible that the respective fluorescent media receive the light to take out light rays having different colors (wavelengths) to the outside. Particularly when the organic EL element emits blue light and the light can be converted to green or red luminescence by the fluorescent medium, the three primary colors of light, that is, blue, green and red can be obtained even from the single organic EL element. Thus, full-color display can be attained, and is preferable.

In order to shut off luminescence from the organic EL element and light from the respective fluorescent medium to improve contrast or reduce dependency on the angle of field, it is also preferred to arrange a light shading layer (black matrix).

The fluorescent medium may be combined with the above-mentioned color filter to prevent a drop in contrast based on outdoor daylight.

② Forming Method

In the case that the fluorescent medium comprises mainly a fluorescent colorant, the medium is preferably made to a film by vacuum deposition or sputtering through a mask for obtaining a desired fluorescent medium pattern.

On the other hand, in the case that the fluorescent medium comprises a fluorescent colorant and a resin, the fluorescent colorant, the resin and an appropriate solvent are mixed, dispersed or solubilized into a liquid and then the liquid is made to a film by spin coating, roll coating, casting and the like method. Thereafter, the fluorescent medium is preferably formed by forming a desired fluorescent medium pattern using photolithography method, or by forming a desired pattern by screen printing and the like method.

③ Thickness

The thickness of the fluorescent medium is not particularly limited if the thickness causes sufficient receipt (absorbance) of luminescence from the organic EL element and does not damage the function for generating fluorescence. The thickness is preferably a value within the range of 10 nm to 1 mm, more preferably a value within the range of 0.5 µm to 1 mm, and still more preferably a value within the range of 1 µm to 100 µm.

[Third Embodiment]

Figure 7:
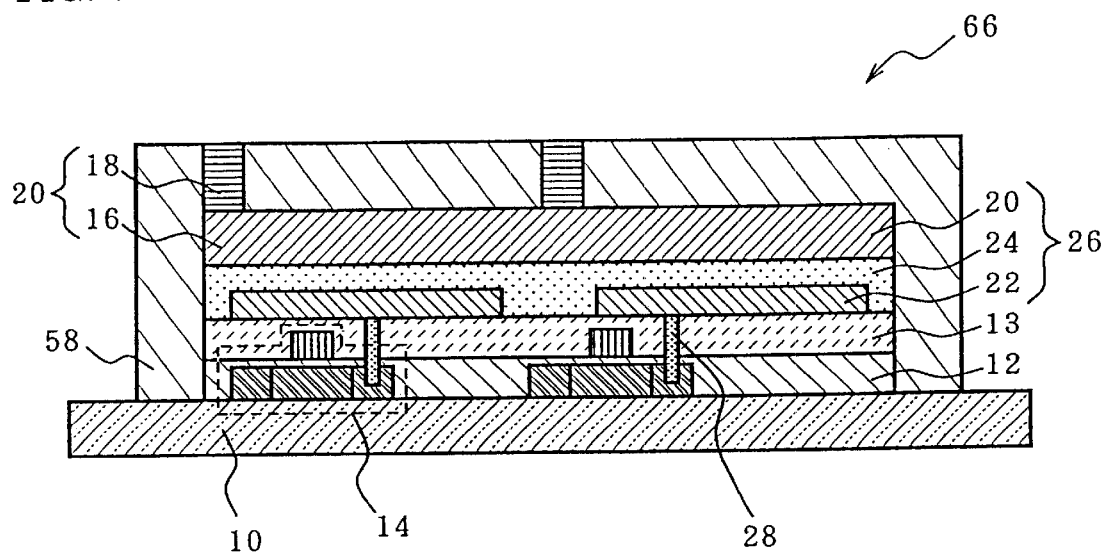
FIG. 7 is a sectional view of an active-driving organic EL light emission device in a third embodiment (No. 1).
Figure 8:
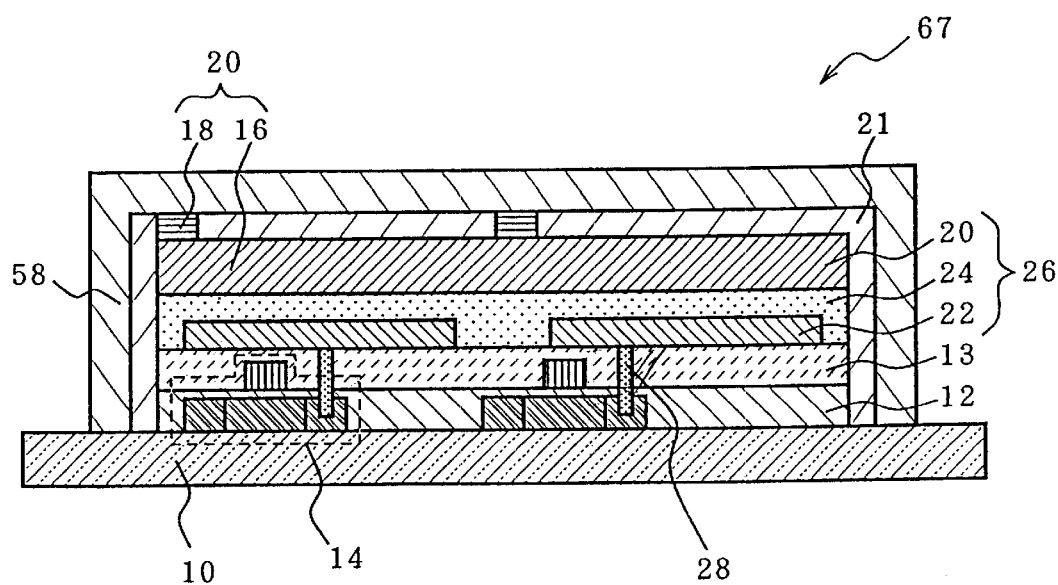
FIG. 8 is a sectional view of an active-driving organic EL light emission device in the third embodiment (No. 2).

As shown in FIGS. 7 and 8, the active-driving organic EL light emission device 66 or 67 of a third embodiment comprises, on the substrate 10, the TFT 14 embedded in the electrically insulating film 12, the organic EL element 26 comprising the organic luminous medium 24 between the upper electrode 20 and the lower electrode 22, the electrically connecting portion 28 for connecting the TFT 14 and the organic EL element 26 electrically to each other, and a sealing member 58.

The third embodiment, wherein the upper electrode 20 comprises the main electrode 16 and the auxiliary electrode 18 and further the assistant element 18 in the upper electrode 20 is disposed in the state that it is embedded in the sealing member 58 and caused to penetrate through the sealing member 58 as shown in FIG. 7, or the assistant element 18 is arranged in the state that it is closely adhered to the sealing member 58 as shown in FIG. 8.

The following will describe the sealing member and the like in the third embodiment, referring appropriately to FIGS. 7 and 8.

(1) Sealing Member

It is preferred that the respective sealing members 58 shown in FIGS. 7 and 8 are arranged around the organic EL display devices 66 and 67 to prevent entry of water into the inside; or that a sealing medium 21, for example, a desiccant, a dry gas, or an inert liquid such as fluorinated hydrocarbon, is put into the thus-arranged sealing member 58 and the organic EL display device 66 and 67.

This sealing member 58 can be used as a supporting substrate in the case that the fluorescent medium or the color filter is arranged outside the upper electrodes.

As such a sealing member, the same material as for the supporting substrate, for example, a glass plate, or a plastic plate may be used. An inorganic oxide layer or an inorganic nitride layer may be used if it is superior in moisture-proofing. Examples thereof include silica, alumina, AlON, SiAlON, $SiN_x$ ($1 \leq x \leq 2$) and the like. The form of the sealing member is not particularly limited, and is preferably, for example, a plate form, or a cap form. When the sealing member is, for example, in a cap form, the thickness thereof is preferably set to a value within the range of 0.01 to 5 mm.

It is also preferred that the sealing member is pushed and fixed into a groove and the like made in a part of the organic EL display device or that the sealing member is fixed onto a part of the organic EL display device with a photocuring type adhesive and the like.

(2) Relationship between the Sealing Member and the Auxiliary Electrode

About the relationship between the sealing member and the auxiliary electrode, it is preferred that the auxiliary electrode 18 is arranged to be embedded in the sealing member 58 or to be closely adhered to the sealing member 58 as shown FIGS. 7 and 8. Various modifications are allowable.

Specifically, it is allowable to dispose a site where assistant wiring 18 is set between an inner space made between the sealing member 58 and the organic EL element 26, or to embed the auxiliary electrode completely in the sealing member 58 and connect the auxiliary electrode and the main electrode 16 electrically to each other through via hole (which may be referred to as a through hole).

[Fourth Embodiment]

A fourth embodiment is a method for manufacturing the active-driving organic EL light emission device 61 of the first embodiment shown in FIG. 1, and is specifically a method for manufacturing the active-driving organic EL light emission device 61, characterized by forming, on the substrate 10, the TFTs 14 embedded in the electrically insulating film 12, the interlayer insulating film 13, the lower electrodes 22, the organic luminous medium 24, the upper electrodes 20 made of the main electrode 16 and the auxiliary electrode 18, and the electrically connection portions 28 for connecting the TFT 14 and the organic EL element 26 electrically to each other.

That is, the fourth embodiment, comprising the steps of forming the organic EL elements 26, forming the TFTs 14 embedded in the electrically insulating film 12, forming the interlayer insulating film 13, forming the lower electrodes 22, forming the organic luminous medium 24, forming the upper electrodes 20 made of the main electrode 16 and the auxiliary electrode 18, and forming the electrically connection portions 28 for connecting the TFT 14 and the organic EL element 26 electrically to each other.

Figure 12:
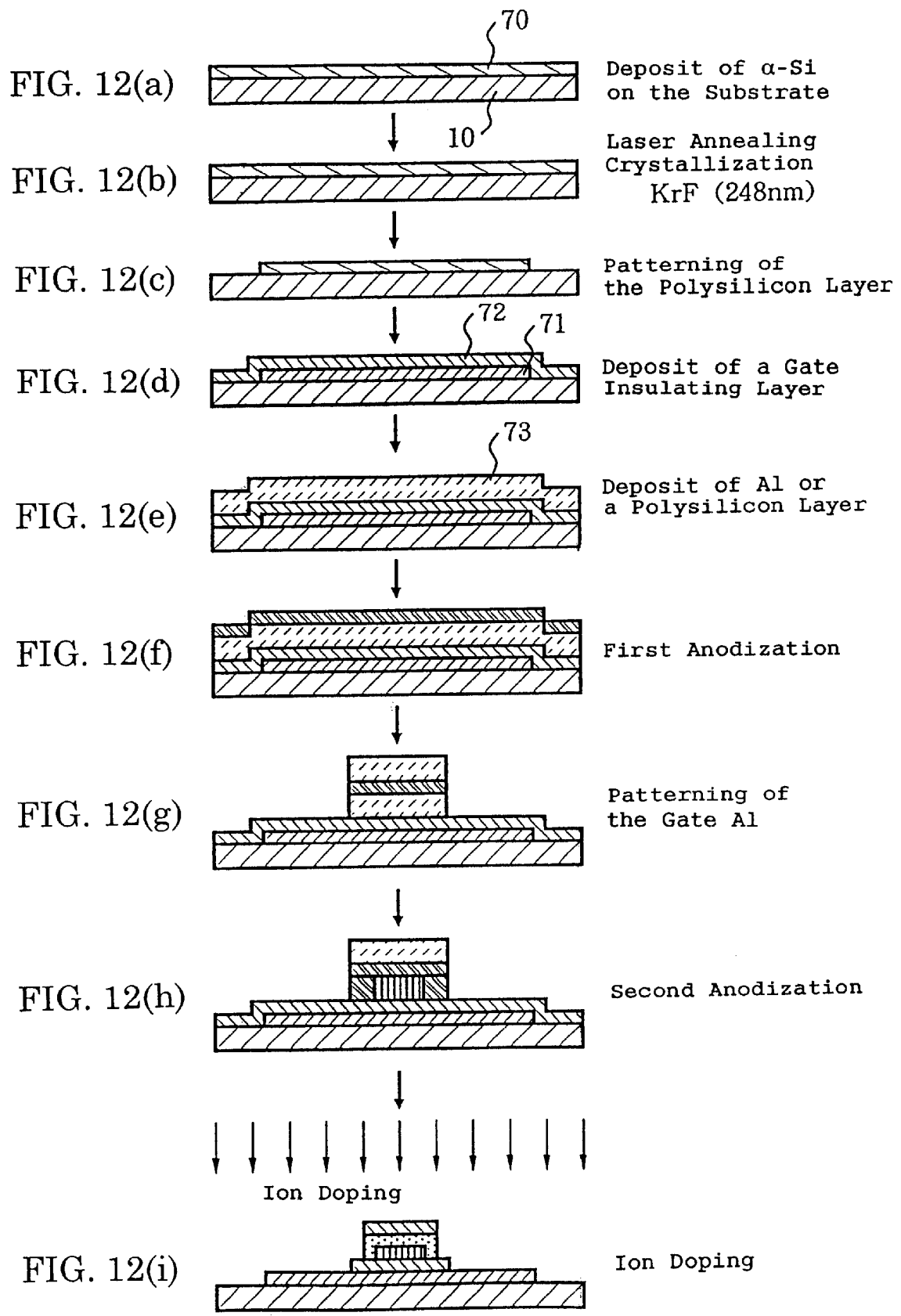
FIG. 12 is a view illustrating a part of the process of forming TFTs.

The following will describe the characteristic portions and the like thereof in the fourth embodiment, referring appropriately to FIG. 12.

(1) Step of Forming the Thin Film Transistors (TFTs)

The step of forming the TFTs 14 (the step of forming the active matrix substrate) will be described, referring to FIGS. 12(a)–(i).

① Formation of an Active Layer

First, FIG. 12(a) shows the step of depositing an α-silicon (α-Si) layer 70 on the substrate 10 by a method such as low pressure chemical vapor deposition (LPCVD).

At this time, the thickness of the α-Si layer 70 is preferably set to a value within the range of 40 to 200 nm. The substrate 10 to be used is preferably a crystal material such as crystal, and is more preferably low-temperature glass. When the low-temperature glass substrate is used, the manufacturing process is preferably carried out at a low-temperature process temperature, for example, 1000° C. or lower and more preferably 600° C. or lower in order to avoid generation of melting or strain in the whole of the manufacturing process or avoid out-diffusion of dopants into an active area.

Next, FIG. 12(b) shows the step wherein the α-Si layer 70 is irradiated with an excimer laser such as a KrF (248 nm) laser to perform annealing crystallization, thereby converting the α-Si to polysilicon (see SID '96, Digest of technical papers pp. 17–28).

About annealing conditions using an excimer laser, it is preferred that substrate temperature is set to a value within the range of 100 to 300° C., and the energy amount of the excimer layer rays is set to a value within the range of 100 to 300 mJ/cm$^2$.

Next, FIG. 12(c) shows the step of patterning the polysilicon crystallized by the annealing into an island form by photolithography method. It is preferred to use, as an etching gas, $CF_4$ gas since superior resolution can be obtained.

Next, the FIG. 12(d) shows the step of depositing an insulating gate material 72 on the surface of the resultant island-form polysilicon 71 and the substrate 10 by chemical vapor deposition (CVD) and the like, to prepare a gate oxide insulating layer 72.

This gate oxide insulating layer 72 comprises preferably silicon dioxide to which chemical vapor deposition (CVD) such as plasma enhanced chemical vapor deposition (PECVD: Plasma Enhanced Chemical Vapor Deposition) or low pressure CVD (LPCVD) can be applied.

The thickness of the gate oxide insulating layer 72 is preferably set to a value within the range of 100 to 200 nm.

Furthermore, substrate temperature is preferably 250–400° C., and annealing at 300–600° C. for 1–3 hours is preferably conducted to obtain a high-quality insulating gate material.

Next, FIG. 12(e) shows the step of depositing and forming a gate electrode 73 by vapor deposition or sputtering. Preferred examples of the constituent material of the gate electrode 73 include Al, AlN and TaN and the like. The thickness thereof is preferably set to a value within the range of 200 to 500 nm.

Next, FIGS. 12(f)–(h) show the steps of patterning the gate electrode 73 and performing anodization. When Al gate is used, anodization is preferably performed two times to attain insulation as shown in FIG. 12(f)–(h). Details of the anodization are disclosed in Japanese Patent Application Publication No. 15120/1996.

Next, FIG. 12(i) shows the step of forming an n+ or p+ doping region by ion doping (ion implantation), to form active layers for a source and a drain. In order that the ion doping can be effectively performed, it is preferred to introduce nitrogen gas and perform heat treatment at 300° C. for about 3 hours during the ion doping.

On the other hand, it is preferred to use polysilicon made of α-Si as the gate electrode 73. Specifically, the polysilicon gate electrode 73 is formed on the gate insulating layer, and subsequently an n type dopant such as arsenic is ion-implanted thereto. Thereafter, a source region and a drain region can be formed on the polysilicon island by photolithography method so that they can be formed inside the polysilicon region.

The gate electrode 73 made of polysilicon can be supplied as a bottom electrode of a capacitance.

② Formation of the Signal Electrode Lines and the Scanning Electrode Lines

Next, an electrically insulating layer, for example, $SiO_x$ ($1 \leq x \leq 2$) is deposited on the resultant active layer by ECRCVD method (Electron Cyclotron Resonance Chemical Vapor Deposition method), and subsequently the signal electrode lines and the scanning electrode lines (referred to as wiring electrodes) are formed and electrical connection is attained. Specifically, the signal electrode lines and the scanning electrode lines are formed by photolithography method and the like, and upper electrodes of the capacitances are formed. Performed are connection of the sources of the second transistors (Tr2) 56 to the scanning electrode lines; connection of the sources of the first transistors (Tr1) 55 to the signal electrode lines; and the like.

It is preferred to form metal lines made of Al alloy, Al, Cr, W, Mo and the like by photolithography method at this time and attain contact of the drains and the sources of the first transistors (Tr1) 55 and the second transistors (Tr2) 56 through openings of the electrically insulating layer which are made from the side of the entire surface thereof.

The thickness of the wiring electrode is preferably 50 nm or more, more preferably 100 nm or more, and still more 100–500 nm.

③ Formation of the Interlayer Insulating Film

In the next step, the interlayer insulating film made of silicon dioxide ($SiO_2$), silicon nitride, polyimide and the like is applied to the whole of the active layer and the electrically insulating layer thereon.

The insulating film made of silicon dioxide can be obtained by supplying, for example, TEOS (tetraethoxysilane) under the condition of a substrate temperature of 250 to 400° C. according to PECVD. The film can also be obtained according to ECRCVD at a substrate temperature of 100 to 300° C. However, it is preferred to use an organic interlayer insulating film since these inorganic insulating films are not easily made flat.

(2) Step of Forming the Organic EL Elements

After the TFT structure and the interlayer insulating film are formed as above, an anode (lower electrodes), an organic luminous layer, a hole injection layer, an electron injection layer and the like are successively formed thereon. Furthermore, a cathode (upper electrodes) is formed so that the organic EL elements can be produced.

For example, the lower electrodes are preferably formed using a method making film-deposition In a dry process, such as vacuum deposition or sputtering. About the organic luminous medium, it is possible to adopt a commonly-known method such as vacuum deposition, spin coating, Langumuir-Blodgett method (LB method), an inkjet method, micelle electrolysis.

The auxiliary electrodes and the main electrodes are preferably formed using vacuum deposition method, sputtering method and the like. Specifically, it is preferred to form the main electrodes made of transparent conductive material by vacuum deposition and the like and then form the auxiliary electrodes made of low-resistance material to make the upper electrodes.

It is preferred to form the auxiliary electrodes and simultaneously connect them electrically to the connecting terminals of the TFTs. It is also preferred that at this time an indium zinc oxide (IZO) and the like, which is an amorphous oxide, as a connecting material is interposed between the auxiliary electrode and the connecting terminal of the TFT.

The organic EL element can be produced according to a reversible order, that is, toward the side of the anode from the cathode (lower electrodes).

Furthermore, it is preferred to form the organic EL element without any break through the vapor deposition.

(3) Sealing Step and the Like

It is preferred that in the sealing step the organic EL elements are formed and connected elactrically to TFTs and subsequently these are fixed with the sealing member to cover the periphery thereof.

In the case that a direct-current voltage is applied to the organic EL elements, the transparent electrode and the electrode are set to polarities of + and −, respectively. In the case that 5–40 voltage is applied to the organic EL elements, luminescence can be observed. Thus, it is also preferred that the organic EL elements are driven before the sealing step to judge whether the organic EL elements obtained are good or bad.

INDUSTRIAL APPLICABILITY

According to the active-driving organic EL light emission device of the present invention, the numerical aperture of pixels can be made large even if the device has TFTs. The sheet resistivity of its upper electrodes can be made low even if luminescence is taken out from the side of the upper electrodes. Thus, images having a high brightness and a homogenous brightness have been able to be displayed.

According to the method for manufacturing an active-driving organic EL light emission device of the present invention, it has become possible to produce effectively an active-driving organic EL light emission device that is low in the sheet resistivity of its upper electrodes and that can take out luminescence from the side of the upper electrodes and can display images having a high brightness and a homogenous brightness.

What is claimed is:

1. An active-driving organic EL light emission device comprising:
   an organic EL element comprising an organic luminous medium between an upper electrode and a lower electrode; and
   a thin film transistor for driving the organic EL element;
   wherein light emitted from the organic EL element is taken out from a side of the upper electrode; and
   the upper electrode comprises a main electrode formed of a transparent conductive material, and an auxiliary electrode formed of a low-resistance material.

2. The device according to claim 1, further comprising an electric switch comprising the thin film transistor and a transistor for selecting a pixel, and
   a signal electrode line and a scanning electrode line for driving the electric switch.

3. The device according to claim 1, wherein the transparent conductive material is at least one material selected from the group consisting of conductive oxides, light-transmissible metal films, non-degenerate semiconductors, organic conductors, and semiconductive carbon compounds.

4. The device according to claim 3, wherein the organic conductor is at least one material selected from the group consisting of conductive conjugated polymers, oxidizing agent-added polymers, reducing agent-added polymers, oxidizing agent-added low-molecules, and reducing agent-added low-molecules.

5. The device according to claim 3, wherein the non-degeneracy semiconductors are at least one material selected from the group consisting of oxides, nitrides, and calchogenide compounds.

6. The device according to claim 3, wherein the carbon compounds comprise at least one material selected from the group consisting of amorphous carbon, graphite, and diamond-like carbon.

7. The device according to claim 1, wherein a plurality of auxiliary electrodes are regularly placed in a plane.

8. The device according to claim 1, wherein a sectional shape of the auxiliary electrode is an overhang form.

9. The device according to claim 1, wherein the auxiliary electrode comprises a lower auxiliary electrode and an upper auxiliary electrode.

10. The device according to claim 9, wherein the lower auxiliary electrode and the upper auxiliary electrode comprise constituent materials having different etching rates.

11. The device according to claim 9, wherein the lower auxiliary electrode and the upper auxiliary electrode of the auxiliary electrode, or one thereof is electrically connected to the main electrode.

12. The device according to claim 1, wherein the auxiliary electrode is formed on an interlayer dielectric constituting the organic EL element.

13. The device according to claim 1, wherein the auxiliary electrode is formed on an electrically insulating film for insulating the lower electrode electrically.

14. The device according to claim 1, wherein the auxiliary electrode is formed on an electrically insulating film for insulating the thin film transistor electrically.

15. The device according to claim 1, wherein an active layer of the thin film transistor comprises polysilicon.

16. The device according to claim 1, wherein an interlayer dielectric is formed on the thin film transistor, the lower electorode of the organic EL element is deposited on the interlayer dielectric, and the thin film transistor and the lower electrode are electrically connected to each other through a via hole made in the interlayer dielectric.

17. The device according to claim 1, wherein charges are injected from the auxiliary electrode to the main electrode and transported in parallel to a main surface of a substrate, and subsequently the charges are injected to the organic luminous medium.

18. The device according to claim 1, wherein the sheet resistivity of the main electrode is set to a value within the range of 1K to 10 M$\Omega$/□.

19. The device according to claim 1, wherein the sheet resistivity of the auxiliary electrode is set to a value within the range of 0.01 to 10 $\Omega$/□.

20. The device according to claim 1, further comprising a fluorescent film and a color filter for color-converting the taken-out light, or one thereof is arranged on the side of the upper electrode.

21. The device according to claim 1, wherein a black matrix is formed on a part of the color filter or the fluorescent film, and the black matrix and the auxiliary electrode overlap with each other in a vertical direction.

22. The device according to claim 1, wherein the auxiliary electrode is formed on the main electrode, and an area of the auxiliary electrode is smaller than an area of the main electrode.

23. The device according to claim 1, wherein the auxiliary electrode is embedded in a sealing member surrounding a periphery thereof.

24. The device according to claim 1, wherein the auxiliary electrode is closely arranged between the sealing member and the main electrode.

25. A method for manufacturing an active-driving organic EL light emission device comprising an organic EL element having an organic luminous medium between an upper electrode and a lower electrode, and a thin film transistor for driving the organic EL element, the method comprising the steps of:
   forming the organic EL element; and
   forming the thin film transistor,
   wherein during the step of forming the organic EL element, the lower electrode and the organic luminous medium are formed and subsequently a main electrode is formed from a transparent conductive material and the upper electrode is formed by forming an auxiliary electrode from a low-resistance material.

* * * * *